(12) United States Patent
Uejima

(10) Patent No.: US 12,402,244 B2
(45) Date of Patent: Aug. 26, 2025

(54) HIGH-FREQUENCY MODULE, COMMUNICATION DEVICE, AND METHOD FOR MANUFACTURING PLURALITY OF HIGH-FREQUENCY MODULES

(71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 387 days.

(21) Appl. No.: 18/168,059

(22) Filed: Feb. 13, 2023

(65) Prior Publication Data

US 2023/0189433 A1  Jun. 15, 2023

Related U.S. Application Data

(63) Continuation of application No. PCT/JP2021/024570, filed on Jun. 29, 2021.

(30) Foreign Application Priority Data

Aug. 27, 2020  (JP) ................. 2020-143576

(51) Int. Cl.
H05K 1/02 (2006.01)
H03F 3/24 (2006.01)
H04B 1/40 (2015.01)

(52) U.S. Cl.
CPC ........... *H05K 1/0243* (2013.01); *H03F 3/245* (2013.01); *H05K 1/0218* (2013.01); *H04B 1/40* (2013.01); *H05K 2201/1003* (2013.01); *H05K 2201/1006* (2013.01); *H05K 2201/10098* (2013.01)

(58) Field of Classification Search
CPC ................................................. H05K 1/0243
USPC ........................................................ 361/748
See application file for complete search history.

(56) References Cited

U.S. PATENT DOCUMENTS

| 8,867,226 B2 * | 10/2014 | Tyhach | H01Q 5/371 |
| | | | 361/748 |
| 2011/0013349 A1 | 1/2011 | Morikita et al. | |
| 2012/0000699 A1 | 1/2012 | Inoue | |
| 2015/0062835 A1 * | 3/2015 | Kai | H01L 23/552 |
| | | | 361/748 |
| 2015/0133067 A1 | 5/2015 | Chang et al. | |

(Continued)

FOREIGN PATENT DOCUMENTS

| JP | H05-267025 A | 10/1993 |
| JP | 2004-260103 A | 9/2004 |

(Continued)

OTHER PUBLICATIONS

International Search Report for PCT/JP2021/024570 dated Sep. 28, 2021.

*Primary Examiner* — Stanley Tso
(74) *Attorney, Agent, or Firm* — McDonald Hopkins LLC

(57) ABSTRACT

A high-frequency module includes: a module board that has main surfaces which are opposed to each other; a plurality of high-frequency components that are arranged on at least one of the main surfaces; a resin member that covers at least one of the main surfaces and has a plurality of side surfaces along an outer edge of the module board; and a shield electrode layer that covers some of the side surfaces without covering other side surfaces.

18 Claims, 8 Drawing Sheets

(56) References Cited

U.S. PATENT DOCUMENTS

| | | | |
|---|---|---|---|
| 2016/0050757 A1* | 2/2016 | Diao | H05K 1/162 336/200 |
| 2019/0206810 A1 | 7/2019 | Kanai et al. | |
| 2019/0363055 A1 | 11/2019 | Yazaki et al. | |
| 2020/0235772 A1* | 7/2020 | Naniwa | H05K 1/0243 |
| 2020/0245448 A1* | 7/2020 | Cho | H05K 1/0218 |
| 2021/0219419 A1 | 7/2021 | Takematsu et al. | |

FOREIGN PATENT DOCUMENTS

| | | |
|---|---|---|
| JP | 2010-225620 A | 10/2010 |
| JP | 2011-035058 A | 2/2011 |
| JP | 2014-179821 A | 9/2014 |
| JP | 2018-033200 A | 3/2018 |
| WO | 2009/122835 A1 | 10/2009 |
| WO | 2018/159290 A1 | 9/2018 |
| WO | 2020/090230 A1 | 5/2020 |

* cited by examiner

HIGH-FREQUENCY MODULE, COMMUNICATION DEVICE, AND METHOD FOR MANUFACTURING PLURALITY OF HIGH-FREQUENCY MODULES

CROSS REFERENCE TO RELATED APPLICATION

This is a continuation of International Application No. PCT/JP2021/024570 filed on Jun. 29, 2021 which claims priority from Japanese Patent Application No. 2020-143576 filed on Aug. 27, 2020. The contents of these applications are incorporated herein by reference in their entireties.

BACKGROUND ART

Technical Field

The present disclosure relates to a high-frequency module, a method for manufacturing a high-frequency module, and a communication device provided with a high-frequency module.

In mobile communication devices such as mobile phones, an arrangement configuration of high-frequency components constituting a high-frequency front-end module has become complicated, especially with the development of multiband. Patent Document 1 discloses a front-end module in which a power amplifier, a switch, a filter, and the like are packaged.

Patent Document 1: U.S. Patent Application Publication No. 2015/0133067

BRIEF SUMMARY

In such a conventional front-end module, there is a concern that isolation between high-frequency components may degrade due to magnetic field coupling, electric field coupling, electromagnetic field coupling, or the like between the high-frequency components.

Hence, the present disclosure provides a high-frequency module, a communication device, and a method for manufacturing a plurality of high-frequency modules that can suppress degradation of isolation between high-frequency components caused by magnetic field coupling, electric field coupling, electromagnetic field coupling, or the like.

A high-frequency module according to one aspect of the present disclosure includes: a module board that has a first main surface and a second main surface which are opposed to each other; a plurality of high-frequency components that are arranged on at least one of the first main surface and the second main surface; a resin member that covers at least one of the first main surface and the second main surface and has a plurality of side surfaces, which include a first side surface and a second side surface, along an outer edge of the module board; and a shield electrode layer that covers the second side surface without necessarily covering the first side surface.

According to the high-frequency module of the one aspect of the present disclosure, degradation of isolation between high-frequency components caused by magnetic field coupling, electric field coupling, electromagnetic field coupling, or the like can be suppressed.

DETAILED DESCRIPTION

Figure 1:
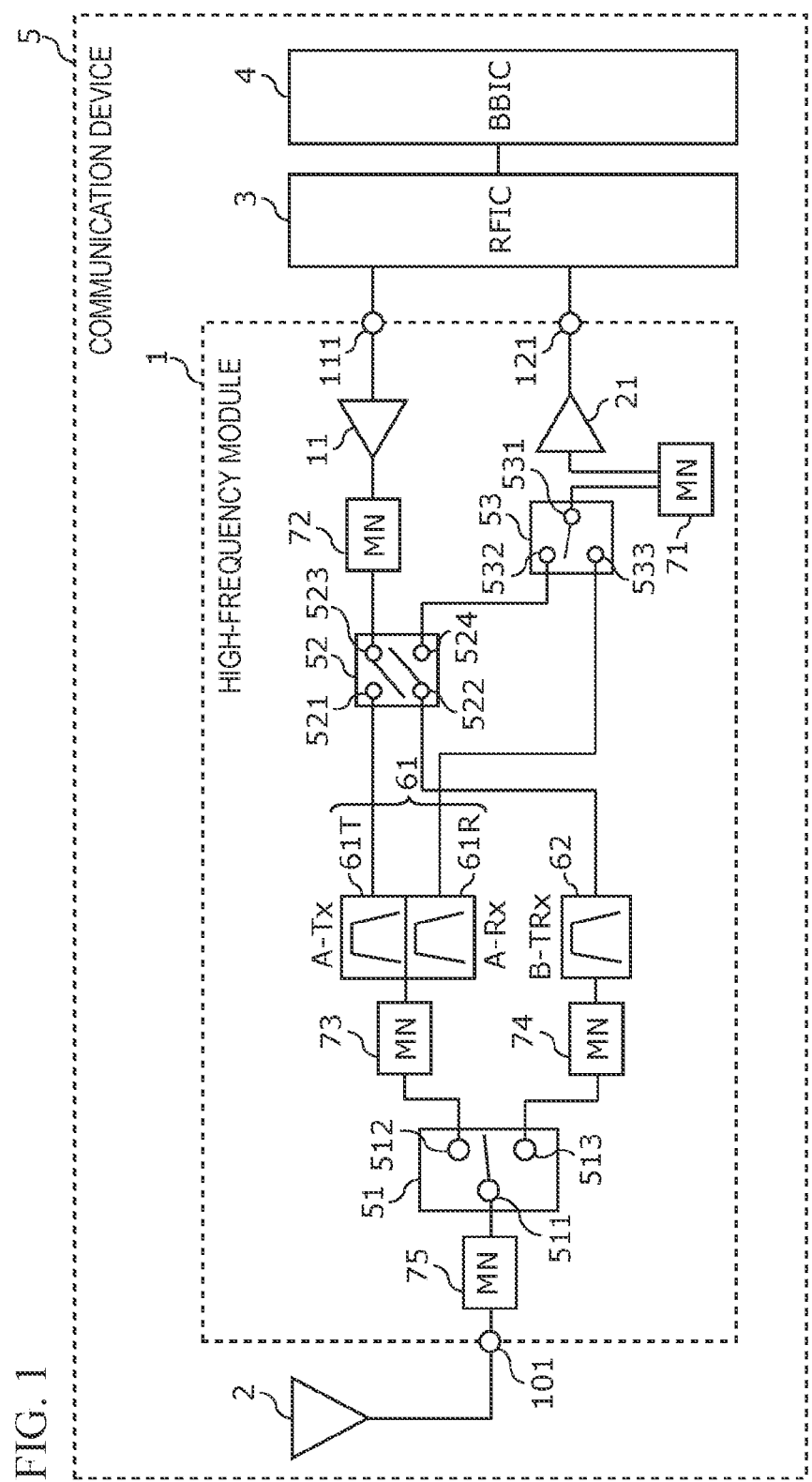
FIG. 1 is a circuit configuration diagram of a high-frequency module and a communication device according to a first embodiment.

Embodiments of the present disclosure will be described in detail below with reference to the accompanying drawings. Note that all of the embodiments described below are generic or specific examples. Numerical values, shapes, materials, components, arrangement and connection forms of the components, and the like shown in the following embodiments are examples, and are not intended to limit the present disclosure.

Note that each drawing is a schematic diagram with emphasis, omission, or proportion adjustment performed as appropriate to illustrate the present disclosure. Thus, each drawing is not necessarily a strict illustration and may differ from the actual shapes, positioning, and proportions. In each drawing, the same reference characters are applied to substantially identical configurations and redundant description may be omitted or simplified.

In each drawing below, an x axis and a y axis are axes that are orthogonal to each other on a plane which is parallel to a main surface of a module board. Specifically, when a module board has a rectangular shape in plan view, the x axis is parallel to a first side of the module board and the y axis is parallel to a second side, being orthogonal to the first side, of the module board. In addition, a z axis is an axis orthogonal to the main surface of the module board, and the positive direction of the z axis indicates the upward direction and the negative direction of the z axis indicates the downward direction.

In the circuit configuration of the present disclosure, "connected" includes not only direct connection by connection terminals and/or wiring conductors, but also electrical connection via other circuit elements. Further, "connected between A and B" means being connected with both of A and B between A and B.

In the component arrangement of the present disclosure, "plan view" means viewing an object by orthographic projection from the positive side of the z axis onto the xy plane. Further, a "distance between A and B" means a length of a line segment connecting a representative point in A and a representative point in B. Here, examples of a point used as a representative point can include a center point of an object or a point closest to a counterpart object, but the representative point is not limited to this. In addition, terms indicating relationships between elements, such as "parallel" and "orthogonal", terms indicating the shape of elements, such as "rectangular", and numerical ranges do not express strict meaning only but also include meaning of substantially equivalent ranges, for example, errors of approximately a few percent.

In addition, "a component is arranged on a board" means that the component is arranged on the board while being in contact with the board, and that the component is arranged above the board without necessarily being in contact with the board (for example, the component is stacked on top of another component arranged on the board), and that the component is arranged in a manner to be partially or entirely embedded within the board. Further, "a component is arranged on a main surface of a board" means that the component is arranged on the main surface of the board while being in contact with the main surface, and that the component is arranged above the main surface without necessarily being in contact with the main surface, and that the component is arranged in a manner to be partially embedded within the board from the main surface side.

First Embodiment

[1.1 Circuit Configurations of High-Frequency Module 1 and Communication Device 5]

Circuit configurations of a high-frequency module 1 and a communication device 5 according to the present embodiment will be described with reference to FIG. 1. FIG. 1 is a circuit configuration diagram of the high-frequency module 1 and the communication device 5 according to a first embodiment.

[1.1.1 Circuit Configuration of Communication Device 5]

The circuit configuration of the communication device 5 will be first described. As illustrated in FIG. 1, the communication device 5 according to the present embodiment includes the high-frequency module 1, an antenna 2, an RFIC 3, and a BBIC 4.

The high-frequency module 1 transmits a high-frequency signal between the antenna 2 and the RFIC 3. The internal configuration of the high-frequency module 1 will be described later.

The antenna 2 is connected with an antenna connection terminal 101 of the high-frequency module 1. The antenna 2 transmits a high-frequency signal outputted from the high-frequency module 1, and also receives a high-frequency signal from the outside and outputs the high-frequency signal to the high-frequency module 1.

The RFIC 3 is an example of a signal processing circuit that processes a high-frequency signal. Specifically, the RFIC 3 processes a high-frequency reception signal, inputted via a reception path of the high-frequency module 1, by down-conversion or the like and outputs the reception signal generated by this signal processing to the BBIC 4. In addition, the RFIC 3 processes a transmission signal, inputted from the BBIC 4, by up-conversion or the like and outputs the high-frequency transmission signal generated by this signal processing to a transmission path of the high-frequency module 1. Further, the RFIC 3 includes a control unit that controls switches, amplifiers, and the like included in the high-frequency module 1. Here, part or all of the function as the control unit of the RFIC 3 may be mounted on the outside of the RFIC 3, such as on the BBIC 4 or the high-frequency module 1.

The BBIC 4 is a baseband signal processing circuit that processes a signal by using an intermediate frequency band which is lower in frequency than the high-frequency signal transmitted by the high-frequency module 1. Examples of a signal processed in the BBIC 4 include an image signal for displaying an image and/or an audio signal for calls through speakers.

In the communication device 5 according to the present embodiment, the antenna 2 and the BBIC 4 are optional components. That is, the communication device 5 does not have to include the antenna 2 and the BBIC 4.

[1.1.2 Circuit Configuration of High-Frequency Module 1]

The circuit configuration of the high-frequency module 1 will now be described. As illustrated in FIG. 1, the high-frequency module 1 includes a power amplifier 11, a low noise amplifier 21, switches 51 to 53, a duplexer 61, a transmission-reception filter 62, matching circuits (MN) 71 to 75, the antenna connection terminal 101, a high-frequency input terminal 111, and a high-frequency output terminal 121.

The antenna connection terminal 101 is connected to the antenna 2.

The high-frequency input terminal 111 is a terminal for receiving a high-frequency transmission signal from the outside of the high-frequency module 1. In the present embodiment, the high-frequency input terminal 111 is a terminal for receiving transmission signals of communication bands A and B from the RFIC 3.

The high-frequency output terminal 121 is a terminal for providing a high-frequency reception signal to the outside of the high-frequency module 1. In the present embodiment, the high-frequency output terminal 121 is a terminal for providing reception signals of the communication bands A and B to the RFIC 3.

Here, the communication band means a frequency band predefined by a standards body or the like (for example, 3rd Generation Partnership Project (3GPP) and Institute of Electrical and Electronics Engineers (IEEE)) for communication systems.

Here, the communication systems mean communication systems built by using the radio access technology (RAT). Examples of the communication systems include 5th generation new radio (SGNR) systems, long term evolution (LTE) systems, and wireless local area network (WLAN) systems, but the communication systems are not limited to these.

A frequency division duplex (FDD) communication band is used as the communication band A. For example, bands 1, 3, 25, and 66 for LTE and/or SGNR and the like can be used as the communication band A, but the communication band A is not limited to these.

A time division duplex (TDD) communication band is used as the communication band B. For example, bands 34 and 39 for LTE and/or SGNR and the like can be used as the communication band B, but the communication band B is not limited to these.

The power amplifier 11 is capable of amplifying transmission signals of the communication bands A and B received at the high-frequency input terminal 111. An input of the power amplifier 11 is connected with the high-frequency input terminal 111 and an output of the power amplifier 11 is connected with the switch 52 via the matching circuit 72.

The low noise amplifier 21 is capable of amplifying reception signals of the communication bands A and B. An input of the low noise amplifier is connected with the switch 53 via the matching circuit 71 and an output of the low noise amplifier 21 is connected with the high-frequency output terminal 121.

The configuration of each of the power amplifier 11 and the low noise amplifier 21 is not especially limited. For example, the power amplifier 11 and/or the low noise amplifier 21 may have a single-stage configuration or a multistage configuration. Further, for example, the power amplifier 11 and/or the low noise amplifier 21 may be a differential amplifier which converts a high-frequency signal into a differential signal (that is, a complementary signal) and amplifies the differential signal.

The duplexer 61 allows a high-frequency signal of the communication band A to pass through. The duplexer 61 transmits a transmission signal and a reception signal of the communication band A by the FDD method. The duplexer 61 includes a transmission filter 61T and a reception filter 61R.

The transmission filter 61T (A-Tx) is an example of a second filter and a third filter, and has a pass band including an uplink operating band of the communication band A. One end of the transmission filter 61T is connected with the antenna connection terminal 101 via the matching circuit 73, the switch 51, and the matching circuit 75. The other end of the transmission filter 61T is connected with the output of the power amplifier 11 via the switch 52.

The uplink operating band means part of a communication band that is designated for uplink. In the high-frequency module 1, the uplink operating band means a transmission band.

The reception filter 61R (A-Rx) is an example of a first filter and the third filter, and has a pass band including a downlink operating band of the communication band A. One end of the reception filter 61R is connected with the antenna connection terminal 101 via the matching circuit 73, the switch 51, and the matching circuit 75. The other end of the reception filter 61R is connected with an input of the low noise amplifier 21 via the switch 53.

The downlink operating band means part of a communication band that is designated for downlink. In the high-frequency module 1, the downlink operating band means a reception band.

The transmission-reception filter 62 (B-TRx) is an example of the first filter, the second filter, and the third filter, and has a pass band including the communication band B. One end of the transmission-reception filter 62 is connected with the antenna connection terminal 101 via the matching circuit 74, the switch 51, and the matching circuit 75. The other end of the transmission-reception filter 62 is connected with the output of the power amplifier 11 via the switch 52 and the matching circuit 72 and is connected with the input of the low noise amplifier 21 via the switches 52 and 53 and the matching circuit 71.

The switch 51 is connected between the antenna connection terminal 101 and each of the duplexer 61 and the transmission-reception filter 62. The switch 51 includes terminals 511 to 513. The terminal 511 is connected to the antenna connection terminal 101 via the matching circuit 75. The terminal 512 is connected to the duplexer 61 via the matching circuit 73. The terminal 513 is connected to the transmission-reception filter 62 via the matching circuit 74.

In this connection configuration, the switch 51 is capable of connecting the terminal 511 to at least one of the terminals 512 and 513 in response to, for example, a control signal from the RFIC 3. That is, the switch 51 is capable of switching connection and disconnection between the antenna 2 and the duplexer 61 and capable of switching connection and disconnection between the antenna 2 and the transmission-reception filter 62. The switch 51 is composed of, for example, a multi-connection switching circuit and is sometimes called an antenna switch.

The switch 52 is connected between each of the transmission filter 61T and the transmission-reception filter 62 and each of the power amplifier 11 and the low noise amplifier 21. The switch 52 includes terminals 521 to 524. The terminals 521 and 522 are connected with the transmission filter 61T and the transmission-reception filter 62, respectively. The terminal 523 is connected with the output of the power amplifier 11 via the matching circuit 72. The terminal 524 is connected with a terminal 532 of the switch 53 and is connected with the input of the low noise amplifier 21 via the switch 53 and the matching circuit 71.

In this connection configuration, the switch 52 is capable of connecting the terminal 521 to the terminal 523 and capable of connecting the terminal 522 to either the terminal 523 or 524 in response to, for example, a control signal from the RFIC 3. That is, the switch 52 is capable of switching connection and disconnection between the transmission filter 61T and the power amplifier 11 and capable of connecting the transmission-reception filter 62 to either the power amplifier 11 or the low noise amplifier 21. The switch 52 is composed of, for example, a multi-connection switching circuit.

The switch 53 is connected between each of the reception filter 61R and transmission-reception filter 62 and the low noise amplifier 21. The switch 53 includes terminals 531 to 533. The terminal 531 is connected with the input of the low noise amplifier 21 via the matching circuit 71. The terminal 532 is connected with the terminal 524 of the switch 52 and is connected with the transmission-reception filter 62 via the switch 52. The terminal 533 is connected with the reception filter 61R.

In this connection configuration, the switch 53 is capable of connecting the terminal 532 and/or the terminal 533 to the terminal 531 in response to, for example, a control signal from the RFIC 3. That is, the switch 53 is capable of switching connection and disconnection between the reception filter 61R and the low noise amplifier 21 and capable of switching connection and disconnection between the transmission-reception filter 62 and the low noise amplifier 21. The switch 53 is composed of, for example, a multi-connection switching circuit.

The matching circuit 71 is connected between each of the reception filter 61R and transmission-reception filter 62 and the low noise amplifier 21. Specifically, the matching circuit 71 is connected between the switch 53 and the input of the low noise amplifier 21. The matching circuit 71 can achieve impedance matching between the low noise amplifier 21 and each of the reception filter 61R and transmission-reception filter 62. The matching circuit 71 includes an inductor 71L and may further include a capacitor.

The matching circuit 72 is connected between each of the transmission filter 61T and transmission-reception filter 62 and the power amplifier 11. Specifically, the matching circuit 72 is connected between the switch 52 and the input of the power amplifier 11. The matching circuit 72 can achieve impedance matching between the power amplifier 11 and each of the transmission filter 61T and transmission-reception filter 62. The matching circuit 72 includes an inductor 72L and may further include a capacitor.

The matching circuit 73 is connected between the duplexer 61 and the antenna connection terminal 101. Specifically, the matching circuit 73 is connected between the duplexer 61 and the switch 51. The matching circuit 73 can achieve impedance matching between the duplexer 61 and the antenna 2. The matching circuit 73 includes an inductor 73L and may further include a capacitor.

The matching circuit 74 is connected between the transmission-reception filter 62 and the antenna connection terminal 101. Specifically, the matching circuit 74 is connected between the transmission-reception filter 62 and the switch 51. The matching circuit 74 can achieve impedance matching between the transmission-reception filter 62 and the antenna 2. The matching circuit 74 includes an inductor 74L and may further include a capacitor.

The matching circuit 75 is connected between each of the duplexer 61 and transmission-reception filter 62 and the antenna connection terminal 101. Specifically, the matching circuit 75 is connected between the switch 51 and the antenna connection terminal 101. The matching circuit 75 can achieve impedance matching between each of the duplexer 61 and transmission-reception filter 62 and the antenna 2. The matching circuit 75 includes an inductor 75L and may further include a capacitor.

Note that some of the circuit elements illustrated in FIG. 1 do not have to be included in the high-frequency module 1. For example, the high-frequency module 1 may include at least two of the power amplifier 11, the low noise amplifier 21, the switches 51 to 53, the duplexer 61, the transmission-reception filter 62, and the inductors 71L to 75L.

[1.2 Component Arrangement in High-Frequency Module 1]

The component arrangement in the high-frequency module 1, which is configured as described above, will now be specifically described with reference to FIGS. 2 to 4.

Figure 2:
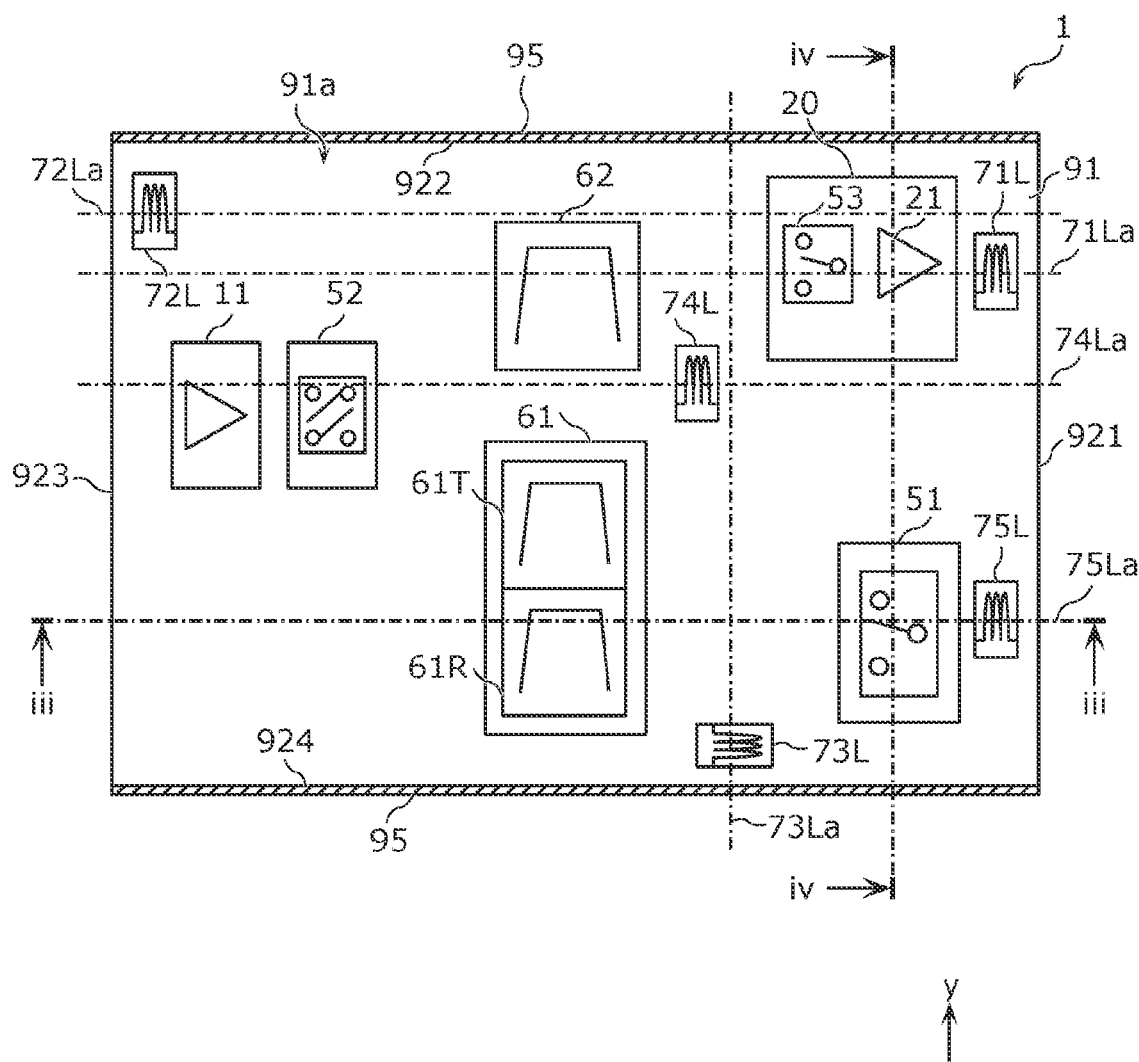
FIG. 2 is a plan view of the high-frequency module according to the first embodiment.

FIG. 2 is a plan view of the high-frequency module 1 according to the first embodiment. Specifically, FIG. 2 is a drawing illustrating a main surface 91a of a module board 91 viewed from the positive side of the z axis. Each of FIG. 3 and FIG. 4 is a sectional view of the high-frequency module 1 according to the first embodiment. Cross sections of the high-frequency module 1 in FIG. 3 and FIG. 4 are cross sections taken along a iii-iii line and a iv-iv line in FIG. 2, respectively.

Figure 3:
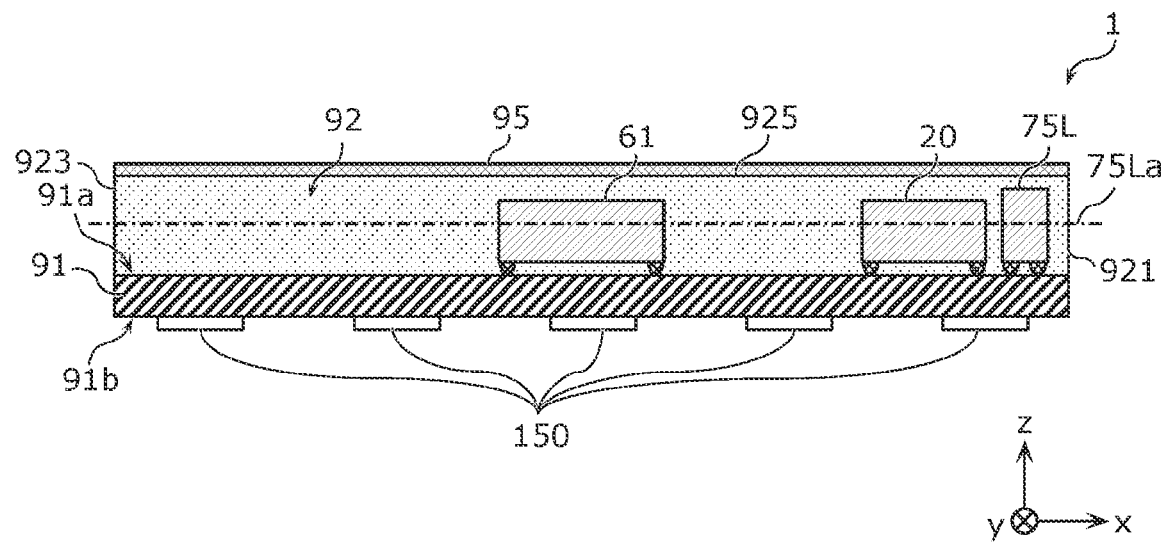
FIG. 3 is a sectional view of the high-frequency module according to the first embodiment.
Figure 4:
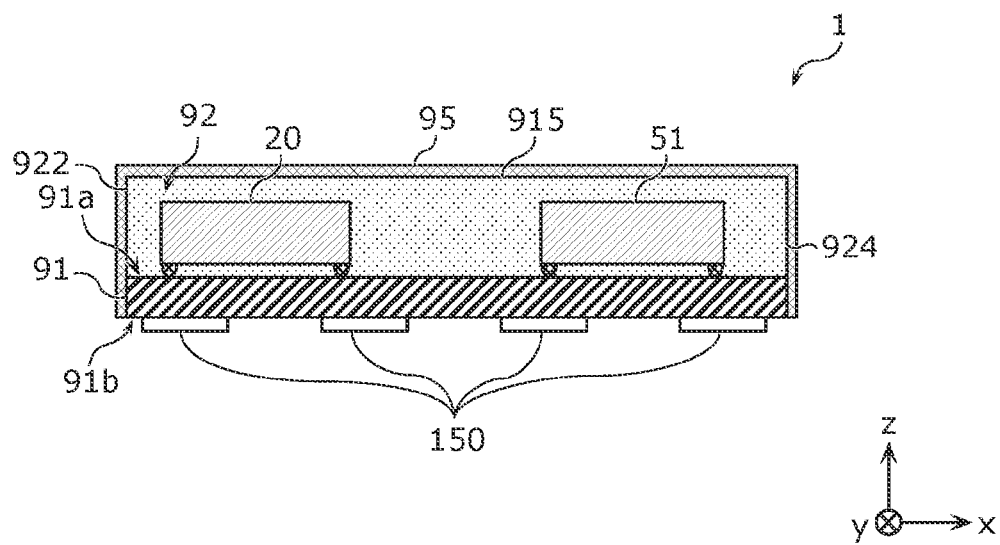
FIG. 4 is a sectional view of the high-frequency module according to the first embodiment.
Figure 5:
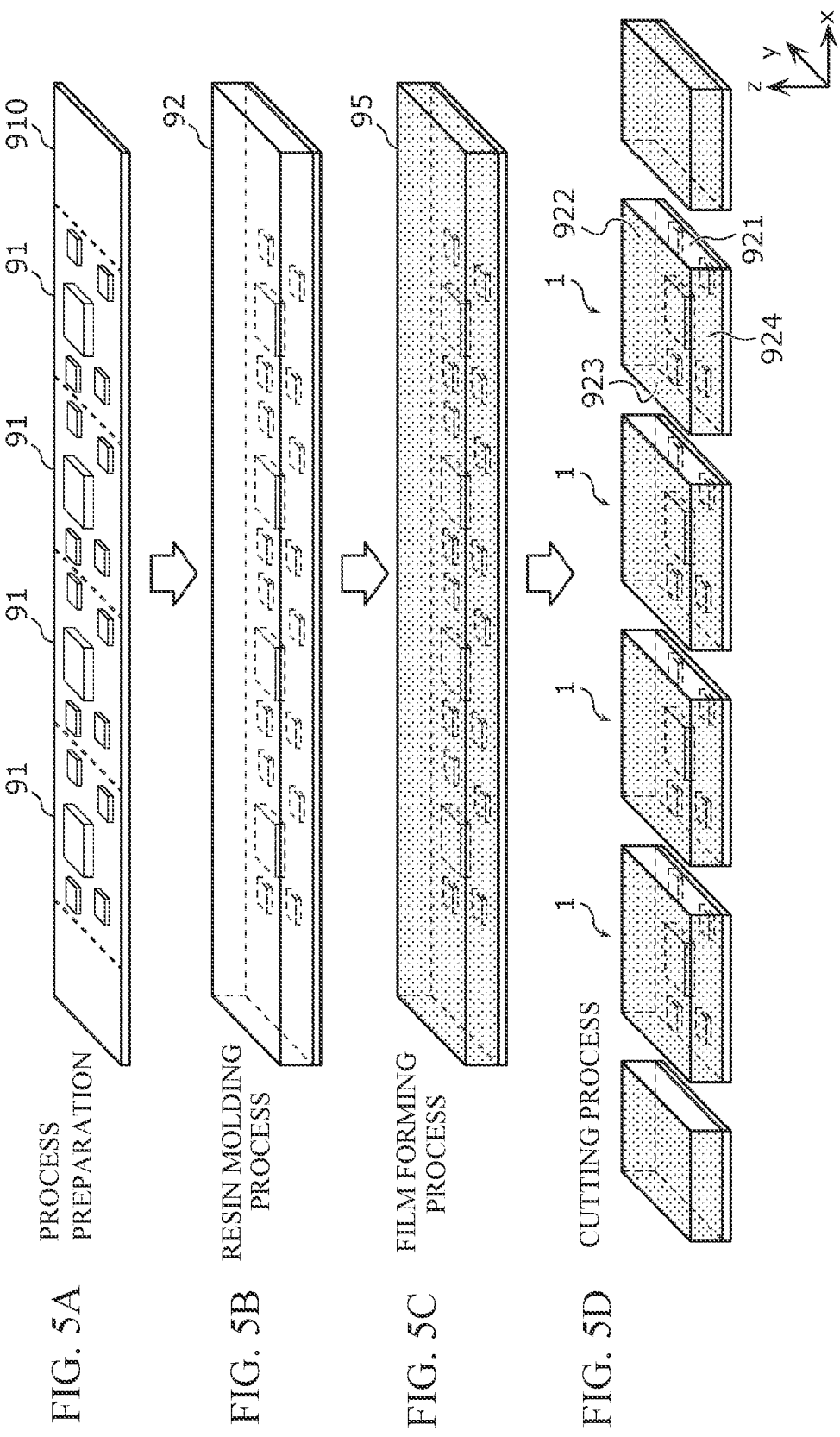
FIGS. 5A-5D are diagrams illustrating a method for manufacturing the high-frequency module according to the first embodiment.

As illustrated in FIGS. 2 to 4, the high-frequency module 1 further includes the module board 91, a resin member 92, a shield electrode layer 95, and a plurality of external connection terminals 150 in addition to a plurality of high-frequency components including the plurality of high-frequency elements illustrated in FIG. 1. Here, FIG. 2 omits illustration of the resin member 92 and a top surface of the shield electrode layer 95.

The module board 91 has main surfaces 91a and 91b that are opposed to each other. The module board 91 has a rectangular shape in plan view in the present embodiment, but the shape of the module board 91 is not limited to the rectangular shape. Examples of a board used as the module board 91 include a low temperature co-fired ceramics (LTCC) board having a laminated structure of a plurality of dielectric layers, a high temperature co-fired ceramics (HTCC) board, a component-embedded board, a board having a redistribution layer (RDL), and a printed board, but the module board 91 is not limited to these.

The main surface 91a is an example of a first main surface. A plurality of high-frequency components and the resin member 92 are arranged on the main surface 91a. In this example, the plurality of high-frequency components include the power amplifier 11, the low noise amplifier 21, the switches 51 to 53, the duplexer 61, the transmission-reception filter 62, and the inductors 71L to 75L.

The main surface 91b is an example of a second main surface. The plurality of external connection terminals 150 are arranged on the main surface 91b.

The resin member 92 is arranged on the main surface 91a of the module board 91 and covers the main surface 91a and components arranged on the main surface 91a. The resin member 92 has a function of ensuring reliability such as mechanical strength and moisture resistance of the components on the main surface 91a.

The resin member 92 is molded into a rectangular parallelepiped shape on the main surface 91a. Specifically, the resin member 92 has four side surfaces 921 to 924 along an outer edge (that is, four sides) of the module board 91 and has a top surface 925 above the main surface 91a of the module board 91.

The side surfaces 921 and 923 are examples of a first side surface and a third side surface. The side surfaces 921 and 923 are along shorter sides of the module board 91 and are opposed to each other. The side surfaces 922 and 924 are examples of a second side surface and a fourth side surface. The side surfaces 922 and 924 are along longer sides of the module board 91 and are opposed to each other.

The shield electrode layer 95 is a metal film that is formed by sputtering or the like, for example, and covers the top surface 925 and the side surfaces 922 and 924 of the resin member 92. The shield electrode layer 95 is set to ground potential and suppresses external noise from entering the components constituting the high-frequency module 1.

Specifically, the shield electrode layer 95 covers the side surfaces 922 and 924 without necessarily covering the side surfaces 921 and 923 among the four side surfaces 921 to 924 of the resin member 92. In other words, the shield electrode layer 95 covers only the two side surfaces 922 and 924 that are opposed to each other, among the four side surfaces 921 to 924 of the resin member 92.

The low noise amplifier 21 and the switch 53 are incorporated in one semiconductor integrated circuit 20. The semiconductor integrated circuit 20 is an electronic component that includes electronic circuits formed on a surface or in the inside of a semiconductor chip (also called die). The semiconductor integrated circuit 20 has a rectangular shape in plan view, in the present embodiment. However, the shape of the semiconductor integrated circuit 20 is not limited to the rectangular shape. In addition, circuit elements incorporated in the semiconductor integrated circuit 20 are not limited to the low noise amplifier 21 and the switch 53. For example, the switch 51 may be incorporated in the semiconductor integrated circuit 20.

The semiconductor integrated circuit 20 may be, for example, made of complementary metal oxide semiconductor (CMOS) and specifically, may be formed by a silicon on insulator (SOI) process. The semiconductor integrated circuit 20 can be accordingly manufactured inexpensively. Here, the semiconductor integrated circuit 20 may be made of at least one of GaAs, SiGe, and GaN. The semiconductor integrated circuit 20 with high quality can be thus realized.

Each of the transmission filter 61T, the reception filter 61R, and the transmission-reception filter 62 may be any of a surface acoustic wave filter, an acoustic wave filter using a bulk acoustic wave (BAW), an LC resonance filter, and a dielectric filter, for example, and further, each of the transmission filter 61T, the reception filter 61R, and the transmission-reception filter 62 is not limited to these.

Each of the inductors 71L to 75L is composed of a coil and is mounted as, for example, a surface mount device (SMD). Here, the inductors 71L to 75L do not have to be SMDs but may be formed inside the module board 91.

The inductor 71L is an example of a first inductor and is arranged near the side surface 921 of the resin member 92. Specifically, the inductor 71L is closer to the side surface

921 of the side surfaces 921 and 922. Further, the inductor 71L is closer to the side surface 921 than the low noise amplifier 21.

A winding axis 71La of a coil constituting the inductor 71L is parallel to the side surfaces 922 and 924 and is orthogonal to the side surfaces 921 and 923. That is, the winding axis 71La intersects with the side surfaces 921 and 923 but does not intersect with the side surfaces 922 and 924. The winding axis 71La accordingly does not intersect with the shield electrode layer 95.

The inductor 72L is an example of a second inductor and is arranged near the side surface 923 of the resin member 92. Specifically, the inductor 72L is closer to the side surface 923 of the side surfaces 923 and 922. Further, the inductor 72L is closer to the side surface 923 than the power amplifier 11.

A winding axis 72La of a coil constituting the inductor 72L is parallel to the side surfaces 922 and 924 and is orthogonal to the side surfaces 921 and 923. That is, the winding axis 72La intersects with the side surfaces 921 and 923 but does not intersect with the side surfaces 922 and 924. The winding axis 72La accordingly does not intersect with the shield electrode layer 95.

The inductor 73L is arranged near the side surface 924 of the resin member 92. Here, a winding axis 73La of a coil constituting the inductor 73L does not intersect with the side surfaces 921 and 923 of the resin member 92 but intersects with the side surfaces 922 and 924 of the resin member 92.

The inductor 74L is an example of a third inductor and is arranged near the center of the module board 91. A winding axis 74La of a coil constituting the inductor 74L is parallel to the side surfaces 922 and 924 and is orthogonal to the side surfaces 921 and 923. That is, the winding axis 74La intersects with the side surfaces 921 and 923 but does not intersect with the side surfaces 922 and 924. The winding axis 74La accordingly does not intersect with the shield electrode layer 95.

The inductor 75L is an example of the third inductor and is arranged near the side surface 921 of the resin member 92. Specifically, the inductor 75L is closer to the side surface 921 of the side surfaces 921 and 924. Further, the inductor 75L is closer to the side surface 921 than the duplexer 61 and the transmission-reception filter 62.

A winding axis 75La of a coil constituting the inductor 75L is parallel to the side surfaces 922 and 924 and is orthogonal to the side surfaces 921 and 923. That is, the winding axis 75La intersects with the side surfaces 921 and 923 but does not intersect with the side surfaces 922 and 924. The winding axis 75La accordingly does not intersect with the shield electrode layer 95.

The plurality of external connection terminals 150 include the antenna connection terminal 101, the high-frequency input terminal 111, and the high-frequency output terminal 121 which are illustrated in FIG. 1. Each of the plurality of external connection terminals 150 is connected with, for example, an input/output terminal and/or a ground terminal on a mother board arranged in the negative direction of the z axis of the high-frequency module 1. Pad electrodes can be used as the plurality of external connection terminals 150, but the external connection terminal 150 is not limited to this.

[1.3 Method for Manufacturing High-Frequency Module 1]

A method for manufacturing the high-frequency module 1 will now be described with reference to FIGS. 5A-5D. FIGS. 5A-5D are diagrams illustrating the method for manufacturing the high-frequency module 1 according to the first embodiment.

(a) Preparation Process

A collective board 910 on which a plurality of high-frequency components are mounted is first prepared. The collective board 910 includes a plurality of module boards 91, thus being an aggregate of the plurality of module boards 91. In FIGS. 5A-5D, the plurality of module boards 91 are aligned in the collective board 910.

(b) Resin Molding Process

Next, the resin member 92 is molded so as to cover the main surface of the collective board 910 and a plurality of high-frequency components on the main surface. For example, resin is poured into a mold placed on the collective board 910 and then the resin hardens to mold the resin member 92. The surface of the resin member 92 which is molded is polished or ground as required.

(c) Film Forming Process

Next, a metal film is formed on the surface of the resin member 92, which covers the collective board 910, as the shield electrode layer 95. That is, the shield electrode layers 95 of a plurality of high-frequency modules 1 are collectively formed. A forming method for the metal film is not especially limited but, for example, a sputtering method or the like can be employed.

(d) Cutting Process

The collective board 910, on which the resin member 92 and the shield electrode layer 95 are formed, is cut and thus a plurality of high-frequency modules 1 are finally manufactured. As a result, the shield electrode layer 95 is not formed on cut surfaces of each of the high-frequency modules 1. In FIGS. 5A-5D, the shield electrode layer 95 is formed on two side surfaces 922 and 924 of the resin member 92 but the shield electrode layer 95 is not formed on two side surfaces 921 and 923 in each of the high-frequency modules 1.

[1.4 Effects, Etc.]

As described above, the high-frequency module 1 according to the present embodiment includes: the module board 91 that has the main surfaces 91a and 91b, which are opposed to each other; a plurality of high-frequency components that are arranged on at least one of the main surfaces 91a and 91b; the resin member 92 that covers at least one of the main surfaces 91a and 91b and has a plurality of side surfaces, which include the side surface 921 and/or the side surface 923 and the side surface 922 and/or the side surface 924, along the outer edge of the module board 91; and the shield electrode layer 95 that covers the side surface 922 and/or the side surface 924 without necessarily covering the side surface 921 and/or the side surface 923.

According to this configuration, the side surface 922 and/or the side surface 924 can be covered by the shield electrode layer 95 without necessarily covering the side surface 921 and/or the side surface 923 by the shield electrode layer 95. A high-frequency component may be magnetically coupled, electrically coupled, or electromagnetically coupled with other high-frequency components via the shield electrode layer 95. Therefore, the configuration in which the side surface 921 and/or the side surface 923 among a plurality of side surfaces are/is not covered by the shield electrode layer 95 can suppress such coupling and improve isolation between the plurality of high-frequency components. In addition, the shield electrode layer 95 covers the side surface 922 and/or the side surface 924 among the plurality of side surfaces, being able to suppress external noise from entering the high-frequency components.

Further, for example, in the high-frequency module 1 according to the present embodiment, the plurality of high-frequency components may include the reception filter 61R, the low noise amplifier 21, and the matching circuit 71 including the inductor 71L, which is connected between the reception filter 61R and the low noise amplifier 21, and the inductor 71L may be closer to the side surface 921 of the side surfaces 921 and 922.

According to this configuration, the inductor 71L can be arranged closer to the side surface 921 which is not covered by the shield electrode layer 95 than to the side surface 922 which is covered by the shield electrode layer 95. Since inductors are easily coupled with other high-frequency components in general, coupling between a plurality of high-frequency components via the shield electrode layer 95 can be effectively suppressed. Further, the inductor 71L is arranged on a reception path. Accordingly, coupling between the inductor 71L and other high-frequency components is suppressed, being able to suppress degradation of reception sensitivity.

Further, for example, in the high-frequency module 1 according to the present embodiment, the plurality of high-frequency components may include the reception filter 61R, the low noise amplifier 21, and the matching circuit 71 including the inductor 71L, which is connected between the reception filter 61R and the low noise amplifier 21, and the inductor 71L may be closer to the side surface 921 than the low noise amplifier 21.

According to this configuration, the inductor 71L can be arranged closer to the side surface 921, which is not covered by the shield electrode layer 95, than the low noise amplifier 21. Since inductors are easily coupled with other high-frequency components in general, coupling between a plurality of high-frequency components via the shield electrode layer 95 can be effectively suppressed. Further, the inductor 71L is arranged on a reception path. Accordingly, coupling between the inductor 71L and other high-frequency components is suppressed, being able to suppress degradation of reception sensitivity.

Further, for example, in the high-frequency module 1 according to the present embodiment, the plurality of high-frequency components may include the reception filter 61R, the low noise amplifier 21, and the matching circuit 71 including the inductor 71L, which is connected between the reception filter 61R and the low noise amplifier 21, and the winding axis 71La of a coil constituting the inductor 71L may intersect with the side surface 921 but does not have to intersect with the side surface 922.

According to this configuration, the inductor 71L can be arranged so that the winding axis 71La of a coil constituting the inductor 71L does not intersect with the side surface 922 covered by the shield electrode layer 95. In general, inductors generate a strong magnetic force along a winding axis of a coil and are prone to generate magnetic field coupling with components on the winding axis. Therefore, the configuration in which the winding axis 71La does not intersect with the side surface 922 covered by the shield electrode layer 95 can effectively suppress magnetic field coupling of the inductor 71L with other high-frequency components via the shield electrode layer 95. Further, the inductor 71L is arranged on a reception path. Accordingly, coupling between the inductor 71L and other high-frequency components is suppressed, being able to suppress degradation of reception sensitivity.

Further, for example, in the high-frequency module 1 according to the present embodiment, the plurality of high-frequency components may include the transmission filter 61T, the power amplifier 11, and the inductor 72L, which is connected between the transmission filter 61T and the power amplifier 11, and the inductor 72L may be closer to the side surface 923 of the side surfaces 922 and 923.

According to this configuration, the inductor 72L can be arranged closer to the side surface 923 which is not covered by the shield electrode layer 95 than to the side surface 922 which is covered by the shield electrode layer 95. Since inductors are easily coupled with other high-frequency components in general, coupling between a plurality of high-frequency components via the shield electrode layer 95 can be effectively suppressed. Further, the inductor 72L is arranged on a transmission path. Accordingly, coupling between the inductor 72L and other high-frequency components is suppressed, being able to suppress degradation of quality of a transmission signal.

Further, for example, in the high-frequency module 1 according to the present embodiment, the plurality of high-frequency components may include the transmission filter 61T, the power amplifier 11, and the inductor 72L, which is connected between the transmission filter 61T and the power amplifier 11, and the inductor 72L may be closer to the side surface 923 than the power amplifier 11.

According to this configuration, the inductor 72L can be arranged closer to the side surface 923 which is not covered by the shield electrode layer 95 than the power amplifier 11. Since inductors are easily coupled with other high-frequency components in general, coupling between a plurality of high-frequency components via the shield electrode layer 95 can be effectively suppressed. Further, the inductor 72L is arranged on a transmission path. Accordingly, coupling between the inductor 72L and other high-frequency components is suppressed, being able to suppress degradation of quality of a transmission signal.

Further, for example, in the high-frequency module 1 according to the present embodiment, the plurality of high-frequency components may include the transmission filter 61T, the power amplifier 11, and the inductor 72L, which is connected between the transmission filter 61T and the power amplifier 11, and the winding axis 72La of a coil constituting the inductor 72L may intersect with the side surface 922 but does not have to intersect with the side surface 923.

According to this configuration, the inductor 72L can be arranged so that the winding axis 72La of a coil constituting the inductor 72L does not intersect with the side surface 922 covered by the shield electrode layer 95. In general, inductors generate a strong magnetic force along a winding axis of a coil and are prone to generate magnetic field coupling with components on the winding axis. Therefore, the configuration in which the winding axis 72La does not intersect with the side surface 922 covered by the shield electrode layer 95 can effectively suppress magnetic field coupling of the inductor 72L with other high-frequency components via the shield electrode layer 95. Further, the inductor 72L is arranged on a transmission path. Accordingly, coupling between the inductor 72L and other high-frequency components is suppressed, being able to suppress degradation of quality of a transmission signal.

Further, for example, in the high-frequency module 1 according to the present embodiment, the plurality of high-frequency components may include the transmission-reception filter 62 and the inductor 75L, which is connected between the transmission-reception filter 62 and the antenna connection terminal 101, and the inductor 75L may be closer to the side surface 921 of the side surfaces 921 and 924.

According to this configuration, the inductor 75L can be arranged closer to the side surface 921 which is not covered by the shield electrode layer 95 than to the side surface 924 which is covered by the shield electrode layer 95. Since inductors are easily coupled with other high-frequency components in general, coupling between a plurality of high-frequency components via the shield electrode layer 95 can be effectively suppressed. Further, the inductor 75L is arranged on a transmission/reception path. Accordingly, coupling between the inductor 75L and other high-frequency components is suppressed, being able to suppress degradation of a quality of a transmission signal and degradation of reception sensitivity.

Further, for example, in the high-frequency module 1 according to the present embodiment, the plurality of high-frequency components may include the transmission-reception filter 62 and the inductor 75L, which is connected between the transmission-reception filter 62 and the antenna connection terminal 101, and the inductor 75L may be closer to the side surface 921 than the transmission-reception filter 62.

According to this configuration, the inductor 75L can be arranged closer to the side surface 921, which is not covered by the shield electrode layer 95, than the transmission-reception filter 62. Since inductors are easily coupled with other high-frequency components in general, coupling between a plurality of high-frequency components via the shield electrode layer 95 can be effectively suppressed. Further, the inductor 75L is arranged on a transmission/reception path. Accordingly, coupling between the inductor 75L and other high-frequency components is suppressed, being able to suppress degradation of a quality of a transmission signal and degradation of reception sensitivity.

Further, for example, in the high-frequency module 1 according to the present embodiment, the plurality of high-frequency components may include the transmission-reception filter 62 and the inductor 74L and/or the inductor 75L, which are/is connected between the transmission-reception filter 62 and the antenna connection terminal 101, and the winding axis 74La of a coil constituting the inductor 74L and/or the winding axis 75La of a coil constituting the inductor 75L may intersect with the side surface 921 but does not have to intersect with the side surface 924.

According to this configuration, the inductor 74L and/or the inductor 75L can be arranged so that the winding axis 74La of a coil constituting the inductor 74L and/or the winding axis 75La of a coil constituting the inductor 75L do/does not intersect with the side surface 924 covered by the shield electrode layer 95. In general, inductors generate a strong magnetic force along a winding axis of a coil and are prone to generate magnetic field coupling with components on the winding axis. Therefore, the configuration in which the winding axis 74La and/or the winding axis 75La do/does not intersect with the side surface 924 covered by the shield electrode layer 95 can effectively suppress magnetic field coupling of the inductor 74L and/or the inductor 75L with other high-frequency components via the shield electrode layer 95. Further, the inductor 75L is arranged on a transmission/reception path. Accordingly, coupling between the inductor 75L and other high-frequency components is suppressed, being able to suppress degradation of a quality of a transmission signal and degradation of reception sensitivity.

Further, for example, in the high-frequency module 1 according to the present embodiment, the plurality of side surfaces may include the side surfaces 921 to 924 and the shield electrode layer 95 may cover the side surfaces 922 and 924 without necessarily covering the side surfaces 921 and 923.

According to this configuration, two side surfaces 921 and 923, which are not covered by the shield electrode layer 95, and two side surfaces 922 and 924, which are covered by the shield electrode layer 95, can be arranged. Accordingly, a balance can be achieved between suppression of coupling between high-frequency components and suppression of external noise intrusion.

Further, for example, in the high-frequency module 1 according to the present embodiment, the side surfaces 921 and 923 may be opposed to each other and the side surfaces 922 and 924 may be opposed to each other.

According to this configuration, the side surfaces 921 and 923, which are not covered by the shield electrode layer 95, can be made opposed to each other and the side surfaces 922 and 924, which are covered by the shield electrode layer 95, can be made opposed to each other. This facilitates arranging an inductor so that a winding axis does not intersect with a side surface covered by the shield electrode layer 95, being able to easily arrange a plurality of high-frequency components so as to suppress coupling between the high-frequency components.

Further, the communication device 5 according to the present embodiment includes the RFIC 3 that processes a high-frequency signal and the high-frequency module 1 that transmits a high-frequency signal between the RFIC 3 and the antenna 2.

According to this configuration, the communication device 5 can achieve the same effects as those of the high-frequency module 1.

Further, the method for manufacturing the high-frequency module 1 according to the present embodiment is a method for manufacturing a plurality of high-frequency modules 1 and includes: a resin molding process for molding the resin member 92 that covers the main surface of the collective board 910, which includes a plurality of module boards 91 on which a plurality of high-frequency components are arranged; a film forming process for forming a metal film on the surface of the resin member 92, which is molded, as the shield electrode layer 95; and a cutting process for cutting the collective board 910 after the forming of the shield electrode layer 95 so as to manufacture a plurality of high-frequency modules 1.

According to the method, the shield electrode layer 95 can be collectively formed for the plurality of high-frequency modules 1 before cutting the collective board 910. Thus, a plurality of high-frequency modules 1 can be more easily manufactured than a method in which the shield electrode layers 95 are separately formed on a plurality of high-frequency modules 1. In addition, the shield electrode layer 95 is not formed on cut surfaces of a plurality of the high-frequency modules 1 thus manufactured. Accordingly, the plurality of the high-frequency modules 1 thus manufactured can suppress coupling between a plurality of high-frequency components via the shield electrode layer 95.

Second Embodiment

A second embodiment will now be described. In the present embodiment, a position of a side surface covered by a shield electrode layer is mainly different from that of the first embodiment described above. The present embodiment will be described below focusing on the difference from the above-described first embodiment with reference to the accompanying drawing.

The circuit configuration of a high-frequency module 1A according to the present embodiment is the same as that of the high-frequency module 1 according to the first embodiment and the illustration and description thereof are therefore omitted.

[2.1 Component Arrangement in High-Frequency Module 1A]

Figure 6:
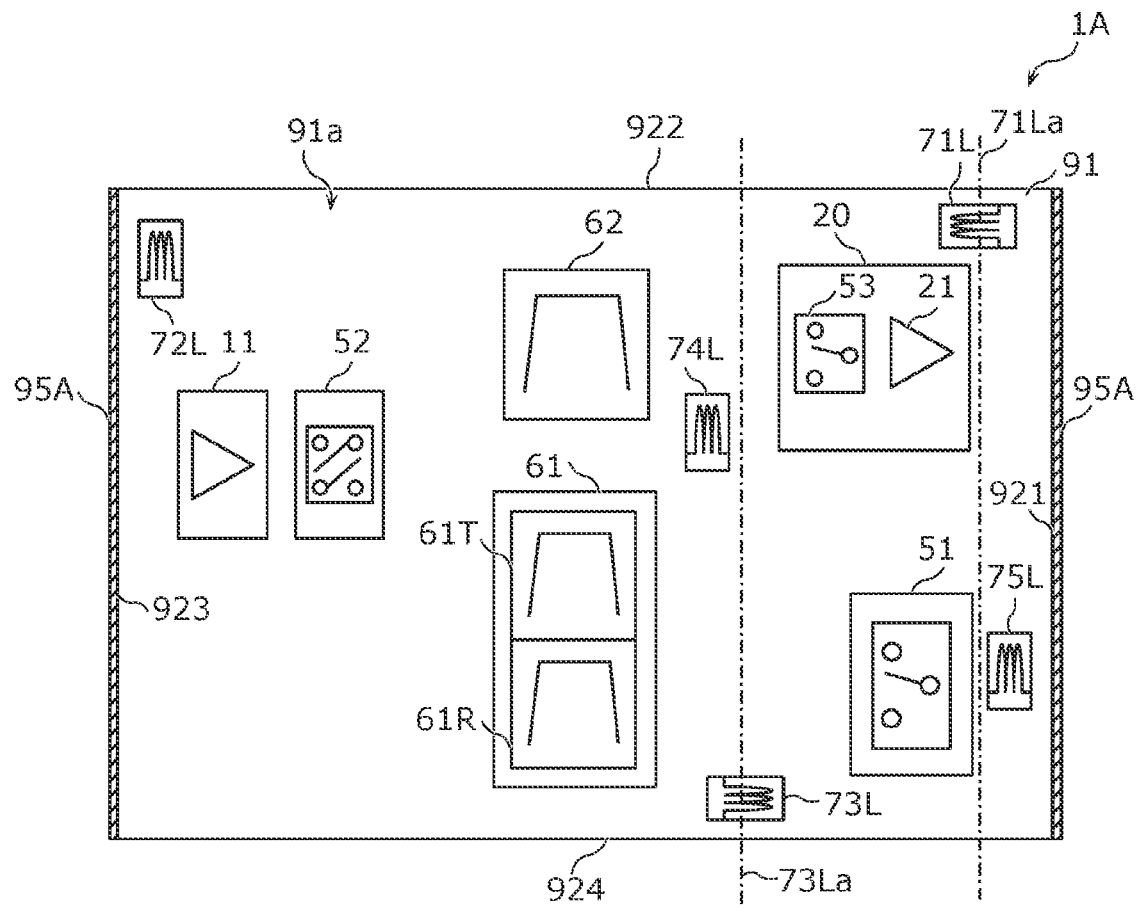
FIG. 6 is a plan view of a high-frequency module according to a second embodiment.

The component arrangement in the high-frequency module 1A according to the present embodiment will now be specifically described with reference to FIG. 6. FIG. 6 is a plan view of the high-frequency module 1A according to the second embodiment.

In the present embodiment, the side surfaces 922 and 924 of the resin member 92 correspond to the first side surface and the third side surface, and the side surfaces 921 and 923 correspond to the second side surface and the fourth side surface.

A shield electrode layer 95A covers the side surfaces 921 and 923 without necessarily covering the side surfaces 922 and 924 among the four side surfaces 921 to 924 of the resin member 92. In other words, the shield electrode layer 95A covers only the two side surfaces 921 and 923 that are opposed to each other, among the four side surfaces 921 to 924 of the resin member 92.

The inductor 71L is an example of the first inductor and is arranged near the side surface 922 of the resin member 92. Specifically, the inductor 71L is closer to the side surface 922 of the side surfaces 921 and 922. Further, the inductor 71L is closer to the side surface 922 than the low noise amplifier 21.

The winding axis 71La of a coil constituting the inductor 71L is parallel to the side surfaces 921 and 923 and is orthogonal to the side surfaces 922 and 924. That is, the winding axis 71La intersects with the side surfaces 922 and 924 but does not intersect with the side surfaces 921 and 923. The winding axis 71La accordingly does not intersect with the shield electrode layer 95.

The inductor 73L is an example of the third inductor and is arranged near the side surface 924 of the resin member 92. Specifically, the inductor 73L is closer to the side surface 924 of the side surfaces 921 and 924. Further, the inductor 73L is closer to the side surface 924 than the duplexer 61 and the transmission-reception filter 62.

The winding axis 73La of a coil constituting the inductor 73L is parallel to the side surfaces 921 and 923 and is orthogonal to the side surfaces 922 and 924. That is, the winding axis 73La intersects with the side surfaces 922 and 924 but does not intersect with the side surfaces 921 and 923. The winding axis 73La accordingly does not intersect with the shield electrode layer 95.

[2.2 Effects, Etc.]

As described above, the high-frequency module 1A according to the present embodiment includes: the module board 91 that has the main surfaces 91a and 91b, which are opposed to each other; a plurality of high-frequency components that are arranged on at least one of the main surfaces 91a and 91b; the resin member 92 that covers at least one of the main surfaces 91a and 91b and has a plurality of side surfaces, which include the side surface 921 and/or the side surface 923 and the side surface 922 and/or the side surface 924, along the outer edge of the module board 91; and the shield electrode layer 95A that covers the side surface 921 and/or the side surface 923 without necessarily covering the side surface 922 and/or the side surface 924.

According to this configuration, the side surface 921 and/or the side surface 923 can be covered by the shield electrode layer 95A without necessarily covering the side surface 922 and/or the side surface 924 by the shield electrode layer 95A. A high-frequency component may be magnetically coupled, electrically coupled, or electromagnetically coupled with other high-frequency components via the shield electrode layer 95A. Therefore, the configuration in which the side surface 922 and/or the side surface 924 among a plurality of side surfaces are/is not covered by the shield electrode layer 95A can suppress such coupling and improve isolation between the plurality of high-frequency components. In addition, the shield electrode layer 95A covers the side surface 921 and/or the side surface 923 among the plurality of side surfaces, being able to suppress external noise from entering the high-frequency components.

Further, for example, in the high-frequency module 1A according to the present embodiment, the plurality of high-frequency components may include the reception filter 61R, the low noise amplifier 21, and the inductor 71L, which is connected between the reception filter 61R and the low noise amplifier 21, and the inductor 71L may be closer to the side surface 922 of the side surfaces 921 and 922.

According to this configuration, the inductor 71L can be arranged closer to the side surface 922 which is not covered by the shield electrode layer 95A than to the side surface 921 which is covered by the shield electrode layer 95A. Since inductors are easily coupled with other high-frequency components in general, coupling between a plurality of high-frequency components via the shield electrode layer 95A can be effectively suppressed. Further, the inductor 71L is arranged on a reception path. Accordingly, coupling between the inductor 71L and other high-frequency components is suppressed, being able to suppress degradation of reception sensitivity.

Further, for example, in the high-frequency module 1A according to the present embodiment, the plurality of high-frequency components may include the reception filter 61R, the low noise amplifier 21, and the inductor 71L, which is connected between the reception filter 61R and the low noise amplifier 21, and the inductor 71L may be closer to the side surface 922 than the low noise amplifier 21.

According to this configuration, the inductor 71L can be arranged closer to the side surface 922, which is not covered by the shield electrode layer 95A, than the low noise amplifier 21. Since inductors are easily coupled with other high-frequency components in general, coupling between a plurality of high-frequency components via the shield electrode layer 95A can be effectively suppressed. Further, the inductor 71L is arranged on a reception path. Accordingly, coupling between the inductor 71L and other high-frequency components is suppressed, being able to suppress degradation of reception sensitivity.

Further, for example, in the high-frequency module 1A according to the present embodiment, the plurality of high-frequency components may include the reception filter 61R, the low noise amplifier 21, and the inductor 71L, which is connected between the reception filter 61R and the low noise amplifier 21, and the winding axis 71La of a coil constituting the inductor 71L may intersect with the side surface 922 but does not have to intersect with the side surface 921.

According to this configuration, the inductor 71L can be arranged so that the winding axis 71La of a coil constituting the inductor 71L does not intersect with the side surface 921 covered by the shield electrode layer 95A. In general, inductors generate a strong magnetic force along a winding axis of a coil and are prone to generate magnetic field coupling with components on the winding axis. Therefore, the configuration in which the winding axis 71La does not intersect with the side surface 921 covered by the shield electrode layer 95A can effectively suppress magnetic field coupling of the inductor 71L with other high-frequency components via the shield electrode layer 95A. Further, the inductor 71L is arranged on a reception path. Accordingly, coupling between the inductor 71L and other high-frequency components is suppressed, being able to suppress degradation of reception sensitivity.

Further, for example, in the high-frequency module 1A according to the present embodiment, the plurality of high-frequency components may include the duplexer 61 and the inductor 73L, which is connected between the duplexer 61 and the antenna connection terminal 101, and the inductor 73L may be closer to the side surface 924 of the side surfaces 921 and 924.

According to this configuration, the inductor 73L can be arranged closer to the side surface 924 which is not covered by the shield electrode layer 95A than to the side surface 921 which is covered by the shield electrode layer 95A. Since inductors are easily coupled with other high-frequency components in general, coupling between a plurality of high-frequency components via the shield electrode layer 95A can be effectively suppressed. Further, the inductor 73L is arranged on a transmission/reception path in the communication band A. Accordingly, coupling between the inductor 73L and other high-frequency components is suppressed, being able to suppress degradation of a quality of a transmission signal in the communication band A and degradation of reception sensitivity in the communication band A.

Further, for example, in the high-frequency module 1A according to the present embodiment, the plurality of high-frequency components may include the duplexer 61 and the inductor 73L, which is connected between the duplexer 61 and the antenna connection terminal 101, and the inductor 73L may be closer to the side surface 924 than the duplexer 61.

According to this configuration, the inductor 73L can be arranged closer to the side surface 924, which is not covered by the shield electrode layer 95A, than the duplexer 61. Since inductors are easily coupled with other high-frequency components in general, coupling between a plurality of high-frequency components via the shield electrode layer 95A can be effectively suppressed. Further, the inductor 73L is arranged on a transmission/reception path in the communication band A. Accordingly, coupling between the inductor 73L and other high-frequency components is suppressed, being able to suppress degradation of a quality of a transmission signal in the communication band A and degradation of reception sensitivity in the communication band A.

Further, for example, in the high-frequency module 1A according to the present embodiment, the plurality of high-frequency components may include the duplexer 61 and the inductor 73L, which is connected between the duplexer 61 and the antenna connection terminal 101, and the winding axis 73La of a coil constituting the inductor 73L may intersect with the side surface 924 but does not have to intersect with the side surface 921.

According to this configuration, the inductor 73L can be arranged so that the winding axis 73La of a coil constituting the inductor 73L does not intersect with the side surface 921 covered by the shield electrode layer 95A. In general, inductors generate a strong magnetic force along a winding axis of a coil and are prone to generate magnetic field coupling with components on the winding axis. Therefore, the configuration in which the winding axis 73La does not intersect with the side surface 921 covered by the shield electrode layer 95A can effectively suppress magnetic field coupling of the inductor 73L with other high-frequency components via the shield electrode layer 95A. Further, the inductor 73L is arranged on a transmission/reception path in the communication band A. Accordingly, coupling between the inductor 73L and other high-frequency components is suppressed, being able to suppress degradation of a quality of a transmission signal in the communication band A and degradation of reception sensitivity of the communication band A.

Third Embodiment

A third embodiment will now be described. The present embodiment is mainly different from the above-described first embodiment in that three side surfaces of a resin member are covered by a shield electrode layer. The present embodiment will be described below focusing on the difference from the above-described first embodiment with reference to the accompanying drawing.

The circuit configuration of a high-frequency module 1B according to the present embodiment is the same as that of the high-frequency module 1 according to the first embodiment and the illustration and description thereof are therefore omitted.

[3.1 Component Arrangement in High-Frequency Module 1B]

Figure 7:
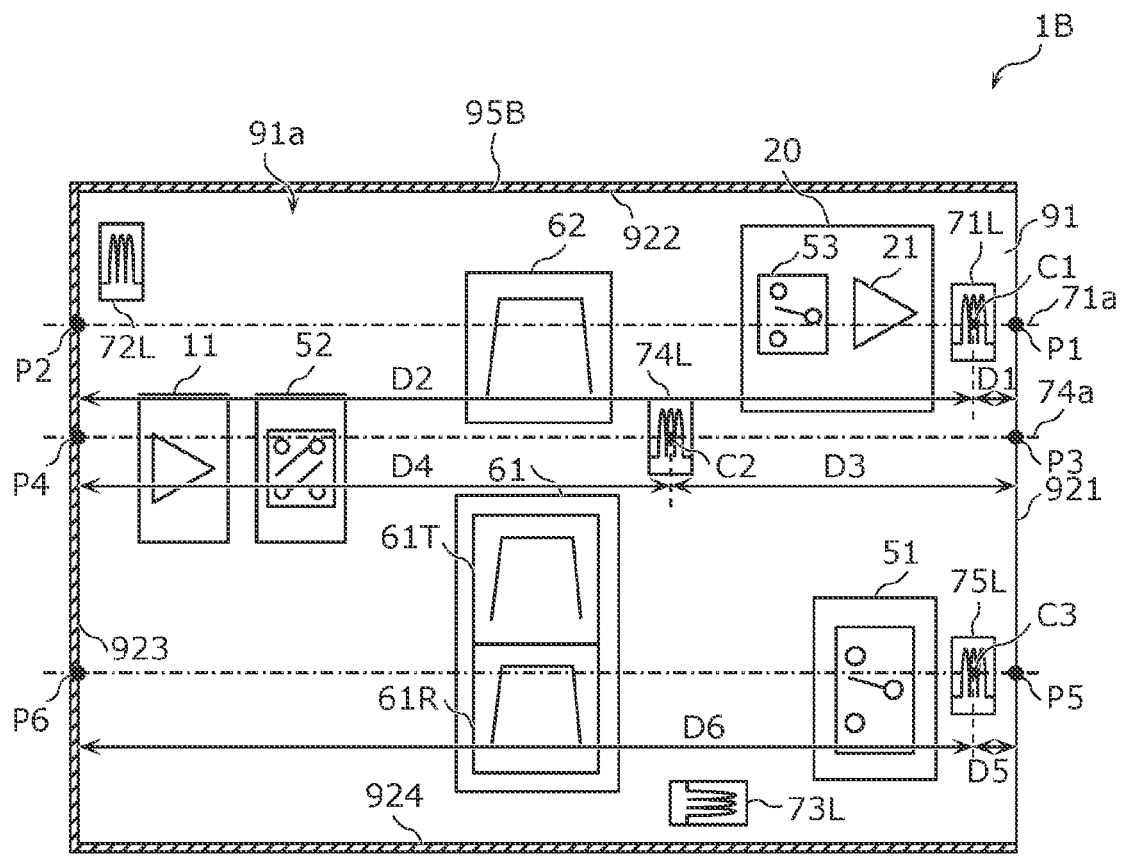
FIG. 7 is a plan view of a high-frequency module according to a third embodiment.

The component arrangement in the high-frequency module 1B according to the present embodiment will now be specifically described with reference to FIG. 7. FIG. 7 is a plan view of the high-frequency module 1B according to the third embodiment.

In the present embodiment, the side surface 921 of the resin member 92 corresponds to the first side surface and the side surfaces 922 to 924 correspond to the second side surface to the fourth side surface.

A shield electrode layer 95B covers the side surfaces 922 to 924 without necessarily covering the side surface 921 among the four side surfaces 921 to 924 of the resin member 92. In other words, the shield electrode layer 95B does not cover only one side surface 921 among the four side surfaces 921 to 924 of the resin member 92.

The inductor 71L is an example of the first inductor and is arranged near the side surface 921 of the resin member 92. The winding axis 71La of a coil constituting the inductor 71L is parallel to the side surfaces 922 and 924 and is orthogonal to the side surfaces 921 and 923. That is, the winding axis 71La intersects with the side surfaces 921 and 923. Accordingly, the winding axis 71La also intersects with the shield electrode layer 95B covering the side surface 923.

A distance D1 from an intersection P1 between the winding axis 71La and the side surface 921 to a center point C1 of the inductor 71L is shorter than a distance D2 from an intersection P2 between the winding axis 71La and the side surface 923 to the center point C1 of the inductor 71L. That is, on the winding axis 71La, the distance D1 between the inductor 71L and the side surface 921 is shorter than the distance D2 between the inductor 71L and the side surface 923.

The inductor 74L is an example of a third inductor and is arranged near the center of the module board 91. The winding axis 74La of a coil constituting the inductor 74L is parallel to the side surfaces 922 and 924 and is orthogonal to the side surfaces 921 and 923. That is, the winding axis 74La intersects with the side surfaces 921 and 923. Accordingly, the winding axis 74La also intersects with the shield electrode layer 95B covering the side surface 923.

A distance D3 from an intersection P3 between the winding axis 74La and the side surface 921 to a center point C2 of the inductor 74L is shorter than a distance D4 from an intersection P4 between the winding axis 74La and the side surface 923 to the center point C2 of the inductor 74L. That is, on the winding axis 74La, the distance D3 between the inductor 74L and the side surface 921 is shorter than the distance D4 between the inductor 74L and the side surface 923.

The inductor 75L is an example of the third inductor and is arranged near the side surface 921 of the resin member 92. The winding axis 75La of a coil constituting the inductor 75L is parallel to the side surfaces 922 and 924 and is orthogonal to the side surfaces 921 and 923. That is, the winding axis 75La intersects with the side surfaces 921 and 923. Accordingly, the winding axis 75La also intersects with the shield electrode layer 95B covering the side surface 923.

A distance D5 from an intersection P5 between the winding axis 75La and the side surface 921 to a center point C3 of the inductor 75L is shorter than a distance D6 from an intersection P6 between the winding axis 75La and the side surface 923 to the center point C3 of the inductor 75L. That is, on the winding axis 75La, the distance D5 between the inductor 75L and the side surface 921 is shorter than the distance D6 between the inductor 75L and the side surface 923.

[3.2 Method for Manufacturing High-Frequency Module 1B]

Figure 9:
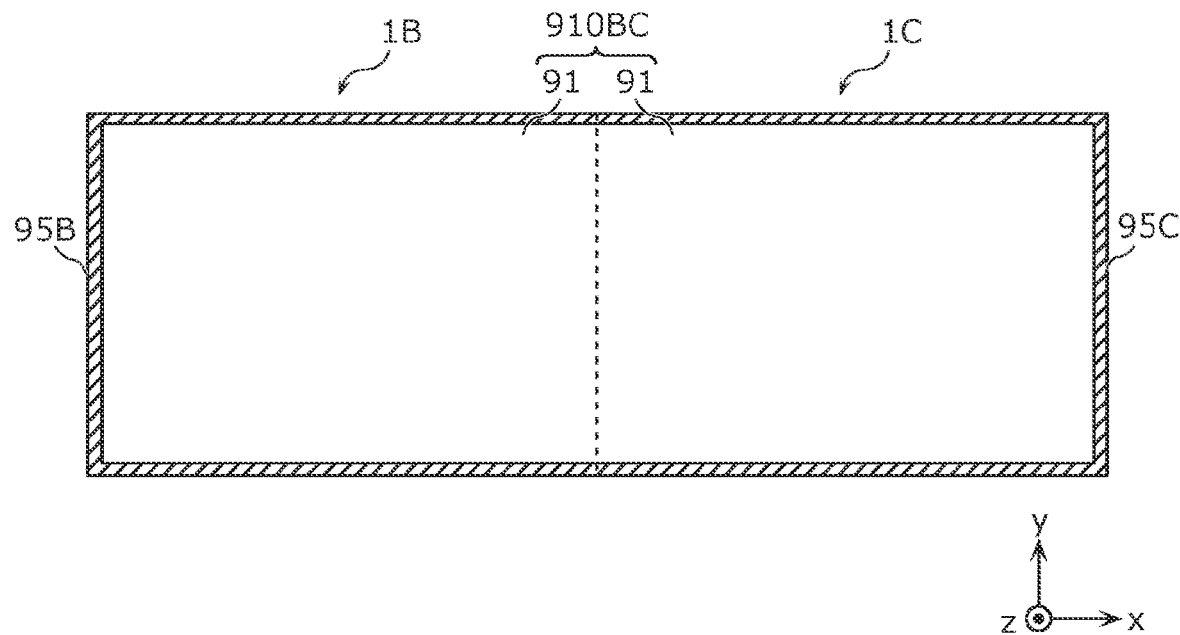
FIG. 9 is a transparent view of a collective board for the high-frequency modules according to the third and fourth embodiments.

A method for manufacturing the high-frequency module 1B will now be described with reference to FIG. 9. FIG. 9 is a transparent view of a collective board 910BC for high-frequency modules 1B and 1C according to the third and fourth embodiments.

In the present embodiment, the collective board 910BC including two module boards 91 is prepared, as illustrated in FIG. 9. Then, a resin molding process, a film forming process, and a cutting process are executed with respect to the collective board 910BC. Thus, the collective board 910BC is cut after a shield electrode layer is formed on a surface of a resin member on the collective board 910BC. On the module board 91 on the left side in the collective board 910BC, the shield electrode layer 95B is formed on three side surfaces 922 to 924 but the shield electrode layer 95B is not formed on one side surface 921 among four side surfaces 921 to 924 of the resin member 92. That is, the high-frequency module 1B is manufactured.

[3.3 Effects, Etc.]

As described above, the high-frequency module 1B according to the present embodiment includes: the module board 91 that has the main surfaces 91a and 91b, which are opposed to each other; a plurality of high-frequency components that are arranged on at least one of the main surfaces 91a and 91b; the resin member 92 that covers at least one of the main surfaces 91a and 91b and has a plurality of side surfaces, which include the side surfaces 921 to 924, along the outer edge of the module board 91; and the shield electrode layer 95B that covers the side surfaces 922 to 924 without necessarily covering the side surface 921.

According to this configuration, the side surfaces 922 to 924 can be covered by the shield electrode layer 95B without necessarily covering the side surface 921 by the shield electrode layer 95B. A high-frequency component may be magnetically coupled, electrically coupled, or electromagnetically coupled with other high-frequency components via the shield electrode layer 95B. Therefore, the configuration in which the side surface 921 among a plurality of side surfaces is not covered by the shield electrode layer 95B can suppress such coupling and improve isolation between the plurality of high-frequency components. In addition, the shield electrode layer 95B covers the side surfaces 922 to 924 among the plurality of side surfaces, being able to suppress external noise from entering the high-frequency components.

Further, for example, in the high-frequency module 1B according to the present embodiment, the plurality of high-frequency components may include the reception filter 61R, the low noise amplifier 21, and the inductor 71L, which is connected between the reception filter 61R and the low noise amplifier 21, the winding axis 71La of a coil constituting the inductor 71L may intersect with each of the side surfaces 921 and 923, and the distance D1 from the intersection P1 between the winding axis 71La and the side surface 921 to the center point C1 of the inductor 71L may be shorter than the distance D2 from the intersection P2 between the winding axis 71La and the side surface 923 to the center point C1 of the inductor 71L.

According to this configuration, when the winding axis 71La of the inductor 71L intersects with both of the side surface 921 which is not covered by the shield electrode layer 95B and the side surface 923 which is covered by the shield electrode layer 95B, the distance D2 between the inductor 71L and the side surface 923 on the winding axis 71La can be set longer than the distance D1 between the inductor 71L and the side surface 921 on the winding axis 71La. This can suppress coupling of the inductor 71L with other high-frequency components via the shield electrode layer 95B covering the side surface 923.

Further, for example, in the high-frequency module 1B according to the present embodiment, the plurality of high-frequency components may include the transmission-reception filter 62 and the inductor 74L, which is connected between the transmission-reception filter 62 and the antenna connection terminal 101, the winding axis 74La of a coil constituting the inductor 74L may intersect with each of the side surfaces 921 and 923, and the distance D3 from the intersection P3 between the winding axis 74La and the side surface 921 to the center point C2 of the inductor 74L may be shorter than the distance D4 from the intersection P4 between the winding axis 74La and the side surface 923 to the center point C2 of the inductor 74L.

According to this configuration, when the winding axis 74La of the inductor 74L intersects with both of the side surface 921 which is not covered by the shield electrode layer 95B and the side surface 923 which is covered by the shield electrode layer 95B, the distance D4 between the inductor 74L and the side surface 923 on the winding axis 74La can be set longer than the distance D3 between the inductor 74L and the side surface 921 on the winding axis 74La. This can suppress coupling of the inductor 74L with other high-frequency components via the shield electrode layer 95B covering the side surface 923.

Further, for example, in the high-frequency module 1B according to the present embodiment, the plurality of high-frequency components may include the transmission-reception filter 62 and the inductor 75L, which is connected between the transmission-reception filter 62 and the antenna connection terminal 101, the winding axis 75La of a coil constituting the inductor 75L may intersect with each of the side surfaces 921 and 923, and the distance D5 from the intersection P5 between the winding axis 75La and the side surface 921 to the center point C3 of the inductor 75L may be shorter than the distance D6 from the intersection P6 between the winding axis 75La and the side surface 923 to the center point C3 of the inductor 75L.

According to this configuration, when the winding axis 75La of the inductor 75L intersects with both of the side surface 921 which is not covered by the shield electrode layer 95B and the side surface 923 which is covered by the shield electrode layer 95B, the distance D6 between the inductor 75L and the side surface 923 on the winding axis 75La can be set longer than the distance D5 between the inductor 75L and the side surface 921 on the winding axis 75La. This can suppress coupling of the inductor 75L with other high-frequency components via the shield electrode layer 95B covering the side surface 923.

Further, for example, in the high-frequency module 1B according to the present embodiment, the plurality of side surfaces may include the side surfaces 921 to 924 and the shield electrode layer 95B may cover the side surfaces 922 to 924 without necessarily covering the side surface 921.

According to this configuration, three side surfaces 922 to 924 can be covered by the shield electrode layer 95B. Accordingly, the high-frequency module 1B can enhance suppression of external noise intrusion more than the high-frequency module 1 or 1A according to the first or second embodiment.

Fourth Embodiment

A fourth embodiment will now be described. The present embodiment is mainly different from the above-described first embodiment in that three side surfaces of a resin member are covered by a shield electrode layer. The present embodiment will be described below focusing on the difference from the above-described first embodiment with reference to the accompanying drawing.

The circuit configuration of a high-frequency module 1C according to the present embodiment is the same as that of the high-frequency module 1 according to the first embodiment and the illustration and description thereof are therefore omitted.

[4.1 Component Arrangement in High-Frequency Module 1C]

Figure 8:
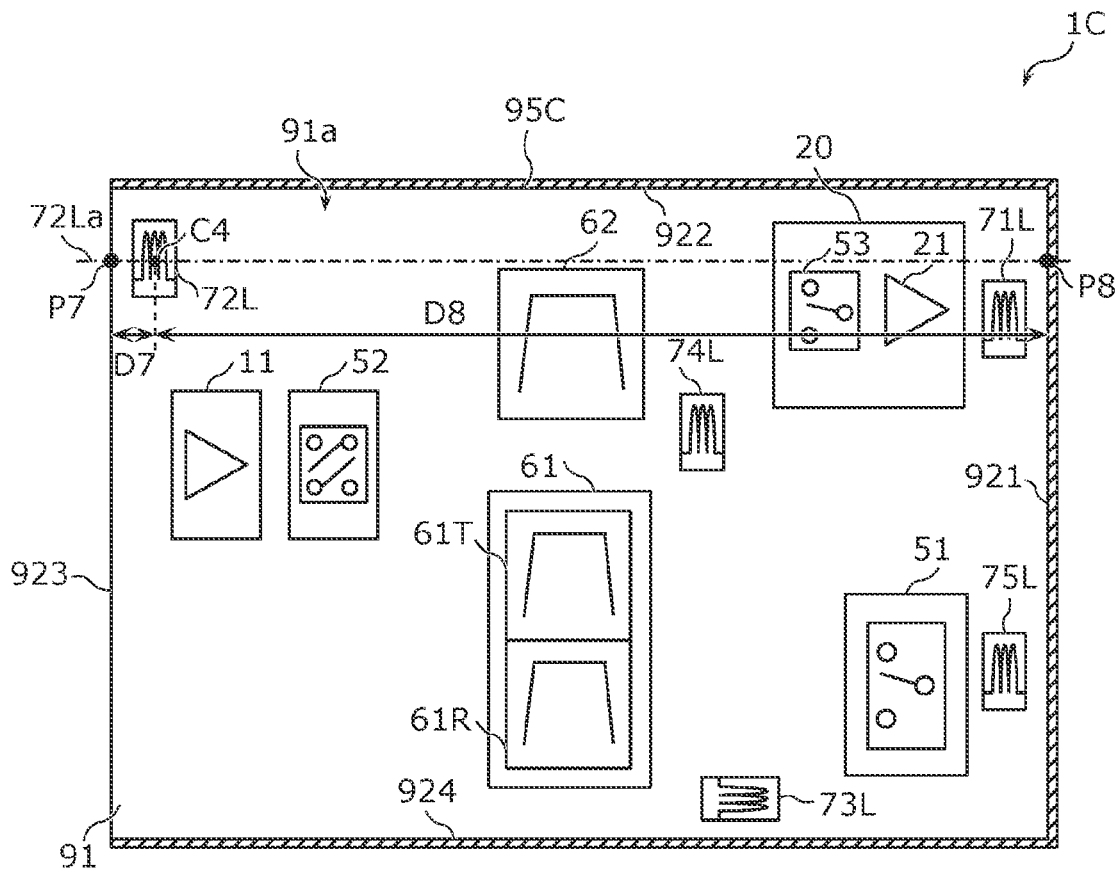
FIG. 8 is a plan view of a high-frequency module according to a fourth embodiment.

The component arrangement in the high-frequency module 1C according to the present embodiment will now be specifically described with reference to FIG. 8. FIG. 8 is a plan view of the high-frequency module 1C according to the fourth embodiment.

In the present embodiment, the side surface 923 of the resin member 92 corresponds to the first side surface and the side surfaces 921, 922, and 924 correspond to the second side surface to the fourth side surface.

A shield electrode layer 95C covers the side surfaces 921, 922, and 924 without necessarily covering the side surface 923 among the four side surfaces 921 to 924 of the resin member 92. In other words, the shield electrode layer 95C does not cover only one side surface 923 among the four side surfaces 921 to 924 of the resin member 92.

The inductor 72L is an example of the second inductor and is arranged near the side surface 923 of the resin member 92. The winding axis 72La of a coil constituting the inductor 72L is parallel to the side surfaces 922 and 924 and is orthogonal to the side surfaces 921 and 923. That is, the winding axis 72La intersects with the side surfaces 921 and 923. Accordingly, the winding axis 72La also intersects with the shield electrode layer 95C covering the side surface 921.

A distance D7 from an intersection P7 between the winding axis 72La and the side surface 923 to a center point C4 of the inductor 72L is shorter than a distance D8 from an intersection P8 between the winding axis 72La and the side surface 921 to the center point C4 of the inductor 72L. That is, that is, on the winding axis 72La, the distance D7 between the inductor 72L and the side surface 923 is shorter than the distance D8 between the inductor 72L and the side surface 921.

[4.2 Method for Manufacturing High-Frequency Module 1C]

A method for manufacturing the high-frequency module 1C will now be described with reference to FIG. 9.

In the present embodiment, the collective board 910BC including two module boards 91 is prepared, as illustrated in FIG. 9. Then, a resin molding process, a film forming process, and a cutting process are executed with respect to the collective board 910BC. Thus, the collective board 910BC is cut after a shield electrode layer is formed on a surface of a resin member on the collective board 910BC. On the module board 91 on the right side in the collective board 910BC, the shield electrode layer 95C is formed on three side surfaces 921, 922, and 924 but the shield electrode layer 95C is not formed on one side surface 923 among four side surfaces 921 to 924 of the resin member 92. The high-frequency module 1C is thus manufactured.

[4.3 Effects, Etc.]

As described above, the high-frequency module 1C according to the present embodiment includes: the module board 91 that has the main surfaces 91a and 91b, which are opposed to each other; a plurality of high-frequency components that are arranged on at least one of the main surfaces 91a and 91b; the resin member 92 that covers at least one of the main surfaces 91a and 91b and has a plurality of side surfaces, which include the side surfaces 921 to 924, along the outer edge of the module board 91; and the shield electrode layer 95C that covers the side surfaces 921, 922, and 924 without necessarily covering the side surface 923.

According to this configuration, the side surfaces 921, 922, and 924 can be covered by the shield electrode layer 95C without necessarily covering the side surface 923 by the shield electrode layer 95C. A high-frequency component may be magnetically coupled, electrically coupled, or electromagnetically coupled with other high-frequency components via the shield electrode layer 95C. Therefore, the configuration in which the side surface 923 among a plurality of side surfaces is not covered by the shield electrode layer 95C can suppress such coupling and improve isolation between the plurality of high-frequency components. In addition, the shield electrode layer 95C covers the side surfaces 921, 922, and 924 among the plurality of side surfaces, being able to suppress external noise from entering the high-frequency components.

Further, for example, in the high-frequency module 1C according to the present embodiment, the plurality of high-frequency components may include the transmission filter 61T, the power amplifier 11, and the inductor 72L, which is connected between the transmission filter 61T and the power amplifier 11, the winding axis 72La of a coil constituting the inductor 72L may intersect with each of the side surfaces 921 and 923, and the distance D7 from the intersection P7 between the winding axis 72La and the side surface 923 to the center point C4 of the inductor 72L may be shorter than the distance D8 from the intersection P8 between the winding axis 72La and the side surface 921 to the center point C4 of the inductor 72L.

According to this configuration, when the winding axis 72La of the inductor 72L intersects with both of the side surface 923 which is not covered by the shield electrode layer 95C and the side surface 921 which is covered by the shield electrode layer 95C, the distance D8 between the inductor 72L and the side surface 921 on the winding axis 72La can be set longer than the distance D7 between the inductor 72L and the side surface 923 on the winding axis 72La. This can suppress coupling of the inductor 72L with other high-frequency components via the shield electrode layer 95C covering the side surface 921.

Further, for example, in the high-frequency module 1C according to the present embodiment, the plurality of side surfaces may include the side surfaces 921 to 924 and the shield electrode layer 95C may cover the side surfaces 921, 922, and 924 without necessarily covering the side surface 923.

According to this configuration, three side surfaces 921, 922, and 924 can be covered by the shield electrode layer 95C. Accordingly, the high-frequency module 1C can enhance suppression of external noise intrusion more than the high-frequency module 1 or 1A according to the first or second embodiment.

Other Embodiments

The high-frequency modules and communication device according to the present disclosure have been described above based on the embodiments. However, the high-frequency modules and communication device according to the present disclosure are not limited to the above-described embodiments. The disclosure also includes other embodiments realized by combining any of the components in the above-described embodiments, modifications obtained by making various changes, which a person skilled in the art can think of, to the above-described embodiments without necessarily departing from the scope of the present disclosure, and various devices incorporating the above-described high-frequency modules and communication device.

Figure 10:
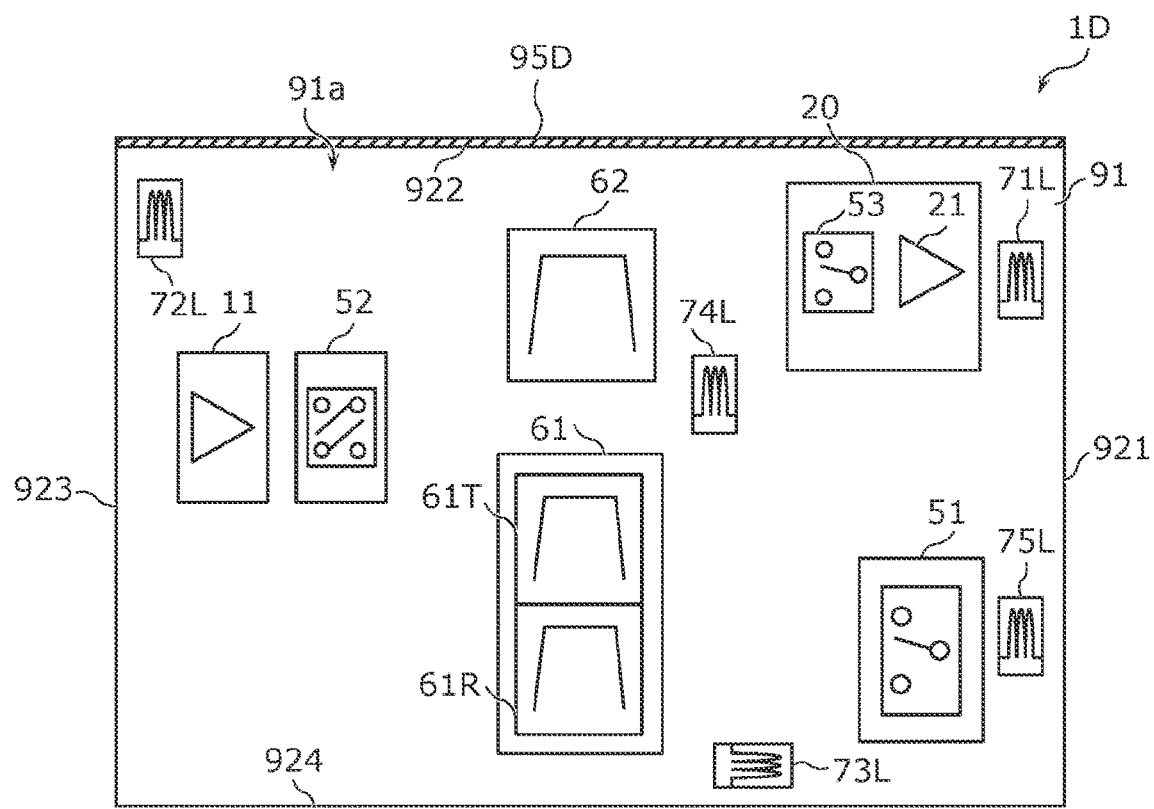
FIG. 10 is a plan view of a high-frequency module according to another embodiment.

For example, two or three side surfaces among the four side surfaces of the resin member 92 are covered by the shield electrode layer in the above-described embodiments, but the configuration is not limited to this. For example, only one side surface may be covered by the shield electrode layer. An example of such a high-frequency module will be described with reference to FIG. 10. FIG. 10 is a plan view of a high-frequency module 1D according to another embodiment. In FIG. 10, the side surface 921 of the resin member 92 corresponds to the first side surface, the side surface 922 corresponds to the second side surface, and the side surfaces 923 and 924 correspond to the third side surface and the fourth side surface. A shield electrode layer 95D covers the side surface 922 without necessarily covering the side surfaces 921, 923, and 924 among the four side surfaces 921 to 924 of the resin member 92. In other words, the shield electrode layer 95D covers only one side surface 922 among the four side surfaces 921 to 924 of the resin member 92. Thus, three side surfaces 921, 923, and 924 are not covered by the shield electrode layer 95D in this configuration. Accordingly, the high-frequency module 1D can enhance suppression of coupling between high-frequency components via the shield electrode layer 95 than the high-frequency module according to each of the above-described embodiments.

In each of the above-described embodiments, a plurality of high-frequency components is arranged on the main surface 91a, but the configuration is not limited to this. For example, the semiconductor integrated circuit 20 and/or the switch 51 may be arranged on the main surface 91b. That is, at least one of the plurality of high-frequency components may be arranged on the main surface 91a and at least one of the rest of the plurality of high-frequency components may be arranged on the main surface 91b. In this configuration, the main surface 91b may be also covered by the resin member as well as the main surface 91a and a post electrode and/or a bump electrode may be used as a plurality of external connection terminals 150. In this configuration, components can be arranged on both surfaces of the module board 91, being able to realize downsizing of the high-frequency module. Here, the switch 52 may be arranged on either the main surface 91a or 91b.

Two switches 52 and 53 are used for connection and disconnection of the duplexer 61 and the transmission-reception filter 62 with respect to the power amplifier 11 and the low noise amplifier 21 in each of the above-described embodiments, but the configuration of the switches is not limited to this. For example, the switches 52 and 53 may be configured as a single switch. In this configuration, the single switch may include five terminals that are each connected with the transmission filter 61T, the reception filter 61R, the transmission-reception filter 62, the output of the power amplifier 11, and the input of the low noise amplifier 21.

The high-frequency module includes the switch 53 for switching filters connected to the low noise amplifier 21 in each of the above-described embodiments, but the high-frequency module does not have to include the switch 53. In this configuration, the high-frequency module may include two low noise amplifiers instead of the low noise amplifier 21. Here, the other end of the reception filter 61R may be connected with one of the two low noise amplifiers and the other end of the transmission-reception filter 62 may be connected with the other of the two low noise amplifiers via the switch 52.

In the first and second embodiments described above, when two side surfaces are covered by the shield electrode layer, the two side surfaces are opposed to each other. However, the configuration is not limited to this. Two side surfaces covered by the shield electrode layer may intersect with each other. For example, the side surfaces 922 and 923 may be covered by the shield electrode layer 95 and the side surfaces 921 and 924 do not have to be covered by the shield electrode layer 95 in the first embodiment. Further, the side surfaces 923 and 924 may be covered by the shield electrode layer 95 and the side surfaces 921 and 922 do not have to be covered by the shield electrode layer 95.

INDUSTRIAL APPLICABILITY

The present disclosure can be widely used in communication devices such as mobile phones as a high-frequency module placed in a front-end section.

REFERENCE SIGNS LIST 1, 1A, 1B, 1C, 1D high-frequency module
2 antenna
3 RFIC
4 BBIC
5 communication device
11 power amplifier
20 semiconductor integrated circuit
21 low noise amplifier
51, 52, 53 switch
61 duplexer
61R reception filter
61T transmission filter
62 transmission-reception filter
71, 72, 73, 74, 75 matching circuit
71L, 72L, 73L, 74L, 75L inductor
71La, 72La, 73La, 74La, 75La winding axis
91 module board
91a, 91b main surface
92 resin member
95, 95A, 95B, 95C, 95D shield electrode layer 101 antenna connection terminal
111 high-frequency input terminal
121 high-frequency output terminal
150 external connection terminal
511, 512, 513, 521, 522, 523, 524, 531, 532, 533 terminal
910, 910BC collective board
921, 922, 923, 924 side surface
925 top surface
C1, C2, C3, C4 center point
D1, D2, D3, D4, D5, D6, D7, D8 distance
P1, P2, P3, P4, P5, P6, P7, P8 intersection

The invention claimed is:

1. A high-frequency module comprising:
a module board that comprises a first main surface and a second main surface, the first main surface and the second main surface being opposed to each other;
a plurality of high-frequency components that are on at least one of the first main surface and the second main surface;
a resin member that covers the at least one of the first main surface and the second main surface and comprises a plurality of side surfaces,
the plurality of side surfaces comprising a first side surface and a second side surface, along an outer edge of the module board; and
a shield electrode layer that covers the second side surface without covering the first side surface,
wherein the plurality of high-frequency components comprise:
a first filter,
a low noise amplifier,
a first inductor that is connected between the first filter and the low noise amplifier, and
a first winding axis of a coil constituting the first inductor intersects with the first side surface but does not intersect with the second side surface.

2. The high-frequency module according to claim 1, wherein
the first inductor is closer to the first side surface than the second side surface.

3. The high-frequency module according to claim 2, wherein the plurality of high-frequency components further comprise:
a second filter,
a power amplifier, and
a second inductor that is connected between the second filter and the power amplifier, wherein the second inductor is closer to the first side surface than the second side surface.

4. The high-frequency module according to claim 1, wherein the plurality of high-frequency components comprise:
a first filter,
a low noise amplifier, and
a first inductor that is connected between the first filter and the low noise amplifier, wherein the first inductor is closer to the first side surface than the low noise amplifier.

5. The high-frequency module according to claim 1, wherein the plurality of high-frequency components comprise:
a first filter,
a low noise amplifier,
a first inductor that is connected between the first filter and the low noise amplifier, and
the first winding axis of a coil constituting the first inductor intersects with each of the first side surface and the second side surface, wherein
a first distance from a first intersection between the first winding axis and the first side surface to a center point of the first inductor is shorter than a second distance from a second intersection between the first winding axis and the second side surface to the center point of the first inductor.

6. The high-frequency module according to claim 1, wherein the plurality of high-frequency components comprise:
a second filter,
a power amplifier, and
a second inductor that is connected between the second filter and the power amplifier, wherein the second inductor is closer to the first side surface than the second side surface.

7. The high-frequency module according to claim 1, wherein the plurality of high-frequency components comprise:
a second filter,
a power amplifier, and
a second inductor that is connected between the second filter and the power amplifier, wherein the second inductor is closer to the first side surface than the power amplifier.

8. The high-frequency module according to claim 1, wherein the plurality of high-frequency components comprise:
a second filter,
a power amplifier,
a second inductor that is connected between the second filter and the power amplifier, and
a second winding axis of a coil constituting the second inductor intersects with the first side surface but does not intersect with the second side surface.

9. The high-frequency module according to claim 1, wherein the plurality of high-frequency components comprise:
a second filter,
a power amplifier,
a second inductor that is connected between the second filter and the power amplifier,
a second winding axis of a coil constituting the second inductor intersects with each of the first side surface and the second side surface, wherein
a first distance from a first intersection between the second winding axis and the first side surface to a center point of the second inductor is shorter than a second distance from a second intersection between the second winding axis and the second side surface to the center point of the second inductor.

10. The high-frequency module according to claim 1, wherein the plurality of high-frequency components comprise:
a third filter, and
a third inductor that is connected between the third filter and an antenna connection terminal, wherein the third inductor is closer to the first side surface than the second side surface.

11. The high-frequency module according to claim 1, wherein the plurality of high-frequency components comprise:
a third filter, and a third inductor that is connected between the third filter and an antenna connection terminal, wherein the third inductor is closer to the first side surface than the third filter.

12. The high-frequency module according to claim 1, wherein the plurality of high-frequency components comprise:
a third filter,
a third inductor that is connected between the third filter and an antenna connection terminal, and
a third winding axis of a coil constituting the third inductor intersects with the first side surface but does not intersect with the second side surface.

13. The high-frequency module according to claim 1, wherein the plurality of high-frequency components comprise:
a third filter,
a third inductor that is connected between the third filter and an antenna connection terminal, and
the third winding axis of a coil constituting the third inductor intersects with each of the first side surface and the second side surface, and
a first distance from a first intersection between the third winding axis and the first side surface to a center point of the third inductor is shorter than a second distance from a second intersection between the third winding axis and the second side surface to the center point of the third inductor.

14. The high-frequency module according to claim 1, wherein the plurality of side surfaces further comprise a third side surface and a fourth side surface, and
the shield electrode layer covers the second side surface and the fourth side surface without covering the first side surface and the third side surface.

15. The high-frequency module according to claim 14, wherein the first side surface and the third side surface are opposed to each other, and
the second side surface and the fourth side surface are opposed to each other.

16. The high-frequency module according to claim 1, wherein the plurality of side surfaces further comprise a third side surface and a fourth side surface, and
the shield electrode layer covers the second side surface, the third side surface, and the fourth side surface without covering the first side surface.

17. The high-frequency module according to claim 1, wherein the plurality of side surfaces further comprise a third side surface and a fourth side surface, and
the shield electrode layer covers the second side surface without covering the first side surface, the third side surface, and the fourth side surface.

18. A communication device comprising:
a signal processing circuit that is configured to process a high-frequency signal; and
the high-frequency module according to claim 1 that is configured to transmit the high-frequency signal between the signal processing circuit and an antenna.

* * * * *

UNITED STATES PATENT AND TRADEMARK OFFICE
CERTIFICATE OF CORRECTION

PATENT NO. : 12,402,244 B2
APPLICATION NO. : 18/168059
DATED : August 26, 2025
INVENTOR(S) : Takanori Uejima It is certified that error appears in the above-identified patent and that said Letters Patent is hereby corrected as shown below:

In the Specification

Column 4, Line 39, "radio (SGNR) systems," should be --radio (5GNR) systems,--

Column 4, Line 45, "and/or SGNR and the like" should be --and/or 5GNR and the like--

Column 4, Line 50, "and/or SGNR and the like" should be --and/or 5GNR and the like--

In the Claims

Column 25, Claim 4:
"4. The high-frequency module according to claim 1, wherein the plurality of high-frequency components comprise:
a first filter,
a low noise amplifier, and
a first inductor that is connected between the first filter and the low noise amplifier, wherein the first inductor is closer to the first side surface than the low noise amplifier."
Should be:
--4. The high-frequency module according to claim 1, wherein the first inductor is closer to the first side surface than the low noise amplifier.--

Column 25, Claim 5:
"5. The high-frequency module according to claim 1, wherein the plurality of high-frequency components comprise:
a first filter,
a low noise amplifier,
a first inductor that is connected between the first filter and the low noise amplifier, and
the first winding axis of a coil constituting the first inductor intersects with each of the first side surface and the second side surface, wherein a first distance from a first intersection between the first winding axis and the first side surface to a center point of the first inductor is shorter than a second Signed and Sealed this
Fourteenth Day of October, 2025

John A. Squires
*Director of the United States Patent and Trademark Office* distance from a second intersection between the first winding axis and the second side surface to the center point of the first inductor."

Should be:

--5. The high-frequency module according to claim 1, wherein the plurality of high-frequency components comprise:

the first winding axis of a coil constituting the first inductor intersects with each of the first side surface and the second side surface, wherein a first distance from a first intersection between the first winding axis and the first side surface to a center point of the first inductor is shorter than a second distance from a second intersection between the first winding axis and the second side surface to the center point of the first inductor.--